US012720879B2

(12) United States Patent
Kao et al.

(10) Patent No.: US 12,720,879 B2
(45) Date of Patent: Aug. 25, 2026

(54) SEMICONDUCTOR STRUCTURE OF BACKSIDE ILLUMINATION CMOS IMAGE SENSOR AND METHOD FOR FORMING THE SAME

(71) Applicant: TAIWAN SEMICONDUCTOR MANUFACTURING COMPANY LTD., Hsinchu (TW)

(72) Inventors: Ching-Hung Kao, Tainan City (TW); Jing-Jyu Chou, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 694 days.

(21) Appl. No.: 17/824,922

(22) Filed: May 26, 2022

(65) Prior Publication Data

US 2023/0387176 A1 Nov. 30, 2023

(51) Int. Cl.
*H10F 39/00* (2025.01)
*H10F 39/12* (2025.01)
*H10F 39/18* (2025.01)

(52) U.S. Cl.
CPC ........... *H10F 39/014* (2025.01); *H10F 39/18* (2025.01); *H10F 39/199* (2025.01); *H10F 39/807* (2025.01)

(58) Field of Classification Search
CPC ........... H01L 27/14689; H01L 27/1463; H01L 27/1464; H01L 27/14643
See application file for complete search history.

(56) References Cited

U.S. PATENT DOCUMENTS 10,446,700 B2 * 10/2019 Wang ..................... G02B 1/005
10,693,023 B2 * 6/2020 Shoyama ................ H10F 39/18
12,094,829 B2 * 9/2024 Or-Bach ................ H10D 88/01
2007/0096176 A1 * 5/2007 Mouli ................... H10F 39/014 257/292
2007/0148847 A1 * 6/2007 Han ...................... H10F 39/014 257/E27.131
2011/0186918 A1 * 8/2011 Sung ..................... H10F 39/014 257/E21.546

OTHER PUBLICATIONS ip.com search (Year: 2026).*

* cited by examiner

*Primary Examiner* — Zandra V Smith
*Assistant Examiner* — Andre C Stevenson
(74) *Attorney, Agent, or Firm* — WPAT LAW; Anthony King

(57) ABSTRACT

The present disclosure provides a method of manufacturing a semiconductor structure of a CMOS image sensor. The method includes providing a substrate; growing an epitaxial layer on the substrate; forming a barrier layer on the epitaxial layer; forming a trench extending into the epitaxial layer; oxidizing the epitaxial layer to form a liner layer; defining a region of a photodiode and a first dopant thickness; implanting dopants into the epitaxial layer around a sidewall of the trench to form a protective layer with a second dopant thickness less than the first dopant thickness; forming an oxide layer in the trench; performing an annealing operation to densify the oxide layer to form a densified oxide layer, wherein the protective layer, expanded from the second dopant thickness to a third dopant thickness less than the first dopant thickness, is kept spaced from the region; and forming the photodiode in the region.

20 Claims, 28 Drawing Sheets

10
190
110
120
R2
130
144
142
S2
R1
160
194
166
192
162
193
156
191
152
150
172
182
164
170
102
100
180
154
184
P1
D3
141

SEMICONDUCTOR STRUCTURE OF BACKSIDE ILLUMINATION CMOS IMAGE SENSOR AND METHOD FOR FORMING THE SAME

BACKGROUND

Complementary metal-oxide-semiconductor (CMOS) image sensors (CIS) are used in numerous applications including digital still cameras. In semiconductor technologies, image sensors are used for sensing exposed lights projected towards a semiconductor substrate. Generally, CIS products include a pixel region and a periphery region. These products utilize an array of active pixels (i.e., image sensor elements or cells) including photodiodes and other elements (e.g., transistors) to convert images into digital data or electrical signals. Each of the photodiodes includes a p-type pinned photodiode and an n-type pinned photodiode to form a P-N junction for transforming photons into electrons. Dark current (DC) and white pixel (WP) performance of the photodiodes are affected by various factors. Therefore, there is a need to improve the performance of a CIS product.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

DETAILED DESCRIPTION

Figure 1:
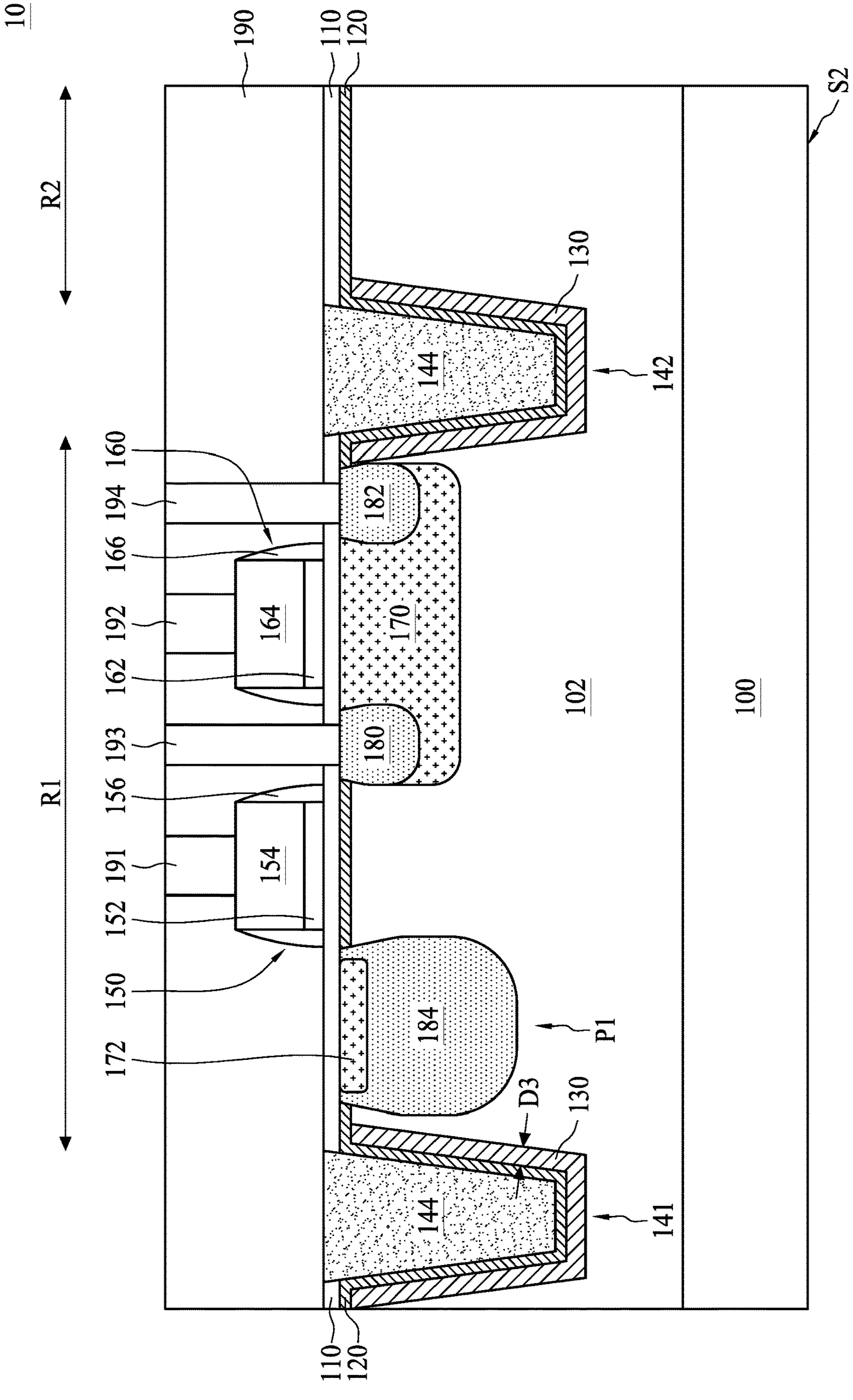
FIG. 1 is a schematic cross-sectional view of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional view of a semiconductor structure 10, which is a structure in a front-end-of-line (FEOL) stage of the formation of a CIS device. The semiconductor structure 10 includes a substrate 100 having a first surface S1 and a second surface S2. The substrate includes a pixel region R1 where a photodiode P1 is disposed and a periphery region R2 adjacent to the pixel region R1. The substrate 100 may be a p-type substrate when P-type dopants such as boron (B), gallium (Ga) and indium (In) ions are doped into the substrate 100. An epitaxial layer 102 is grown on the substrate 100. A top portion of the substrate 100 is converted into the epitaxial layer 102. A barrier layer 110 is disposed on the epitaxial layer 102. The barrier layer 110 including silicon nitride ($Si_3N_4$) layer is disposed on the epitaxial layer 102. A liner layer 120 is disposed on the substrate 100. The liner layer 120 is an oxide layer grown on surfaces of the epitaxial layer 102. A doped region 130 including boron dopants is disposed below the liner layer 120 and within the epitaxial layer 102. The doped region 130 has a dopant thickness D3 of about 50 nanometers (nm). Isolation features 141 and 142 are disposed in the epitaxial layer 102 or the substrate 100. Each of the isolation features 141, 142 is surrounded by one doped region 130. The doped region 130 extends below the isolation features 141, 142. Each of the isolation features 141, 142 includes a densified HARP oxide 144 which is a dielectric material such as silicon oxide ($SiO_2$) formed by a high aspect-ratio process (HARP) and an annealing operation. Other isolation features may be disposed on the substrate 100, and not all of them are illustrated.

Still referring to FIG. 1, a transfer transistor 150 and a reset transistor 160 are disposed in the pixel region R1 on the substrate 100. The transfer transistor 150 includes an insulating layer 152 and a conductive layer 154 disposed on the insulating layer 152. The reset transistor 160 includes an insulating layer 162 and a conductive layer 164 disposed on the insulating layer 162. A spacer 156 is disposed surrounding the transfer transistor 150 and a spacer 166 is disposed surrounding the reset transistor 160. A silicide layer (not shown) may be disposed on the conductive layer 154 or 164. Although not shown, other transistors or logic elements may be disposed in the periphery region R2 on the substrate 100.

A p-type well 170, a floating diffusion region 180, a source/drain region 182, an n-type doped region 184 and p-type pinned region 172 are disposed in the substrate 100. The p-type well is located at a portion of the epitaxial layer 102 below the reset transistor 160 and extending in a direction away from the photodiode P1. The P well 170 has a p-type dopant concentration that is higher than adjacent portions of the epitaxial layer 102. The floating diffusion region 180 and the source/drain region 182 are n-type regions. An n-type dopant, such as phosphorus, arsenic, or antimony, may be used to form the n-type regions. The floating diffusion region 180 is disposed between the transfer transistor 150 and the reset transistor 160. The source/drain region 182 is disposed on one side of the reset transistor 160 opposite to the floating diffusion region 180. The n-type doped region 184 is a region where the photodiode P1 is disposed. The n-type doped region 184 is disposed on one side of the transfer transistor 150 opposite to the floating diffusion region 180. An interface between the n-type doped region 184 and the p-type epitaxial layer 102 (or substrate 100) forms a photosensitive charge accumulating region for collecting photo-generated charges. The charge accumulating region may be referred to as a space charge region or a depletion region. The p-type pinned region 172 is disposed in a top portion of the n-type doped region 184 between the isolation feature 141 and the transfer transistor 150. A P-N junction is formed at an interface between the p-type pinned region 172 and the n-type doped region 184. The p-type pinned region 172 and the n-type doped region 184 form the photodiode P1 used for transforming photons into electrons.

The transfer transistor 150 may transfer charges generated or gathered in the photodiode P1 to the floating diffusion region 180. The reset transistor 160 is used for discharging the charges in the floating diffusion region 180 by setting an electric potential thereon during reset. The reset transistor 160 may periodically reset the charges stored in the floating diffusion region 180.

An interlayer dielectric (ILD) layer 190 including silicon oxide or borophosphosilicate glass (BPSG) is disposed over the transfer transistor 150 and the reset transistor 160. The ILD layer 190 covers the barrier layer 100 and the isolation features 141, 142. Conductive vias 191, 192, 193 and 194 are formed in the ILD layer 190 and penetrate the ILD layer 190. The conductive vias 191, 192, 193 and 194 are electrically coupled to the transfer transistor 150, reset transistor 160, the floating diffusion region 180 and the source/drain region 182, respectively.

Figure 2:
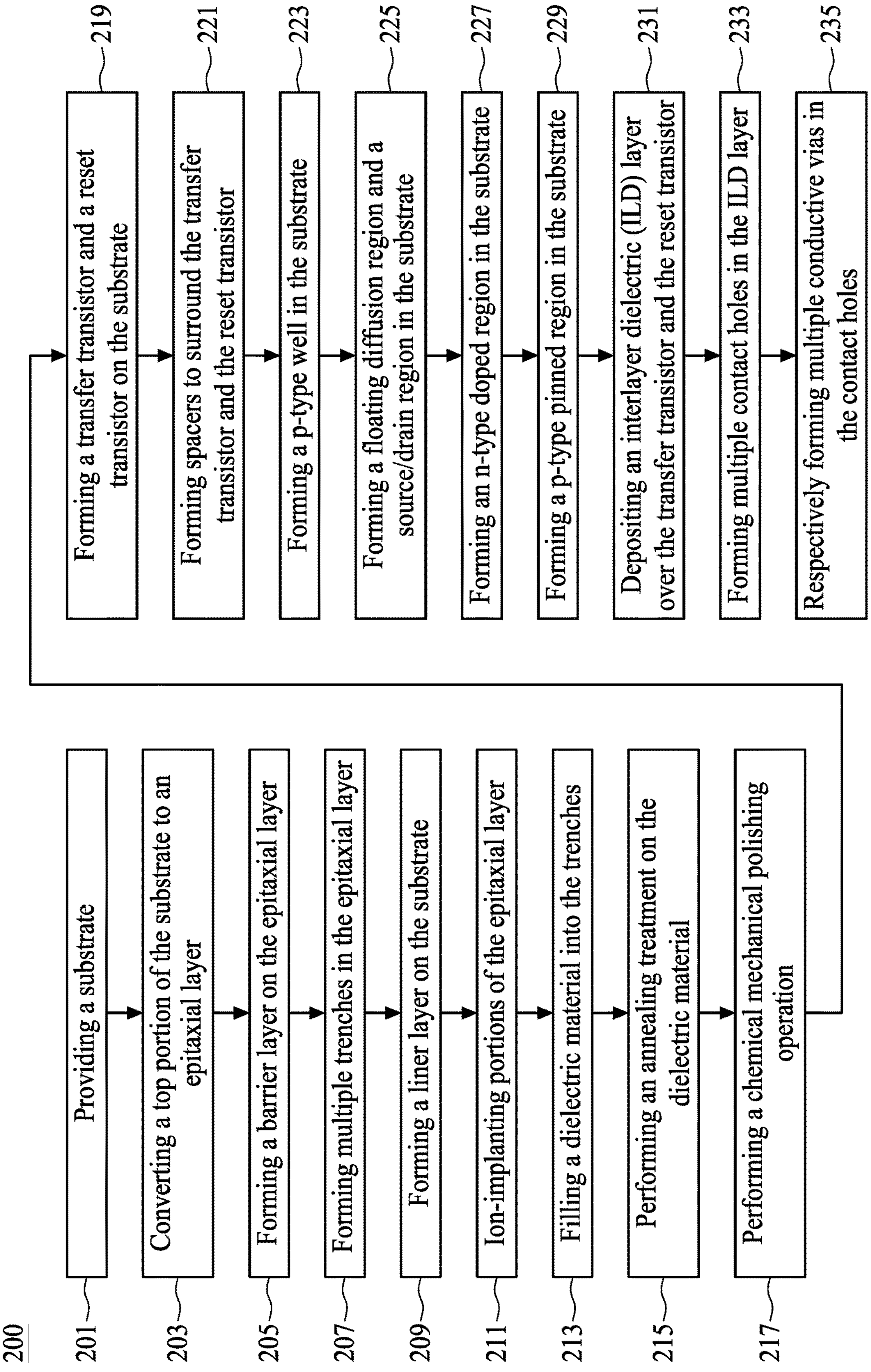
FIG. 2 is a flow diagram showing a method of fabricating a semiconductor structure in FIG. 1, in accordance with some embodiments of the present disclosure.
Figure 22:
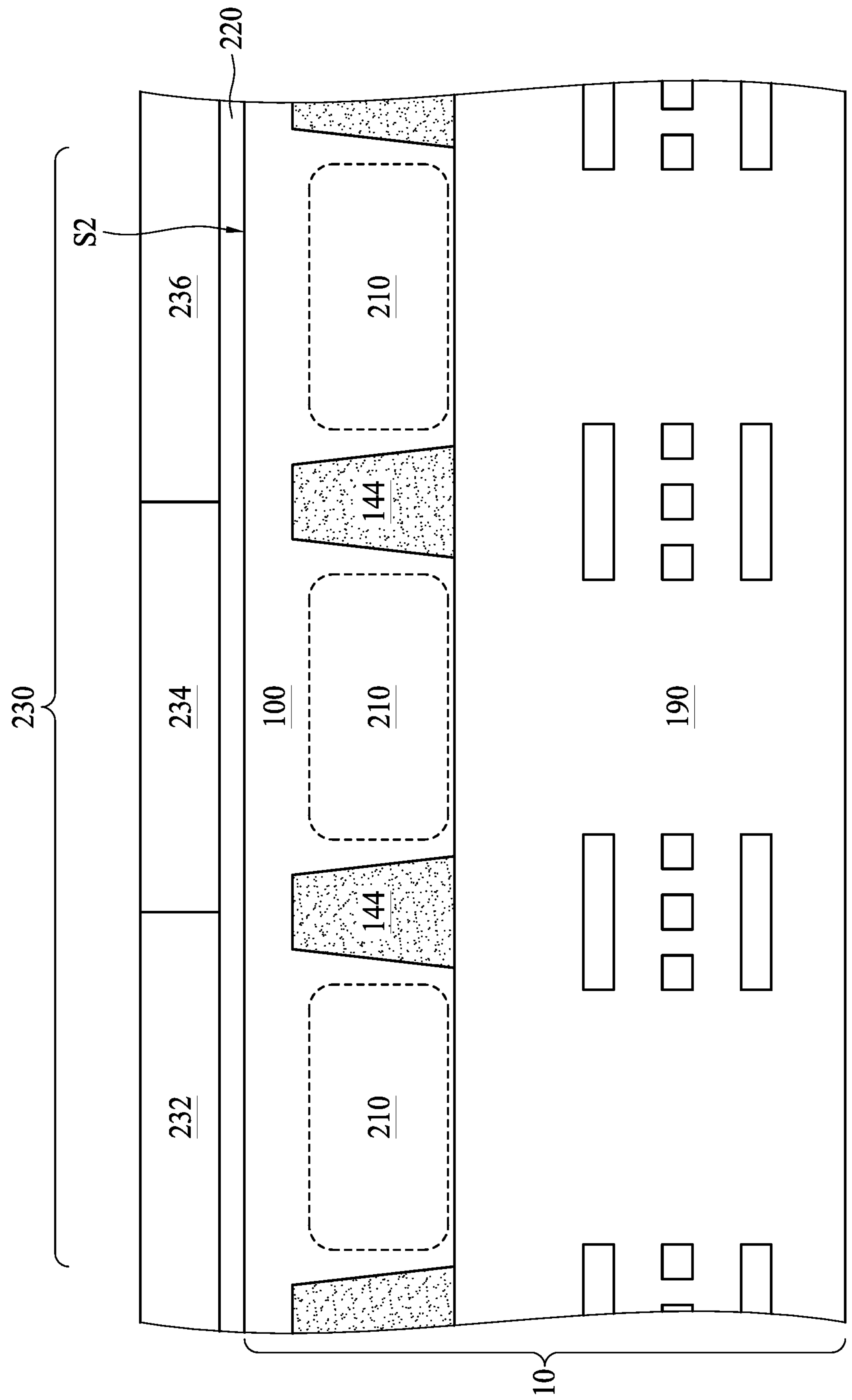
FIGS. 22 and 23 are schematic cross-sectional views illustrating a formation of a semiconductor device formed based on the semiconductor structure in FIG. 1 using the method in FIG. 2, in accordance with some embodiments of the present disclosure.
Figure 23:
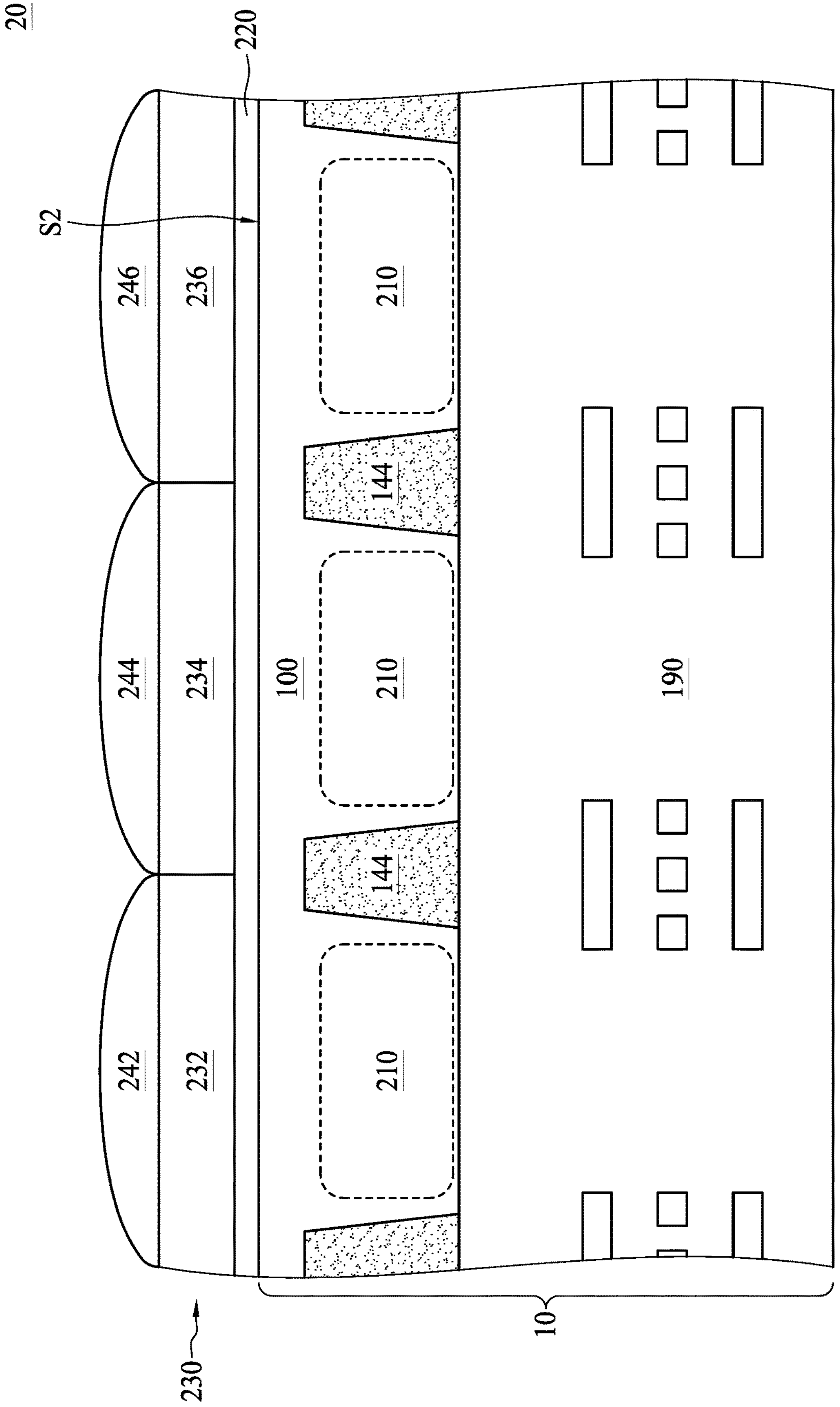

FIG. 2 is a flow diagram showing a method 200 of fabricating the semiconductor structure 10 in FIG. 1. FIGS. 3 to 21 are schematic cross-sectional views illustrating sequential operations of the method 200 shown in FIG. 2. FIGS. 22 and 23 are schematic cross-sectional views illustrating a formation of a backside illumination (BSI) CMOS image sensor (CIS) 20 based on the semiconductor structure 10 formed using the method 200.

Figure 3:
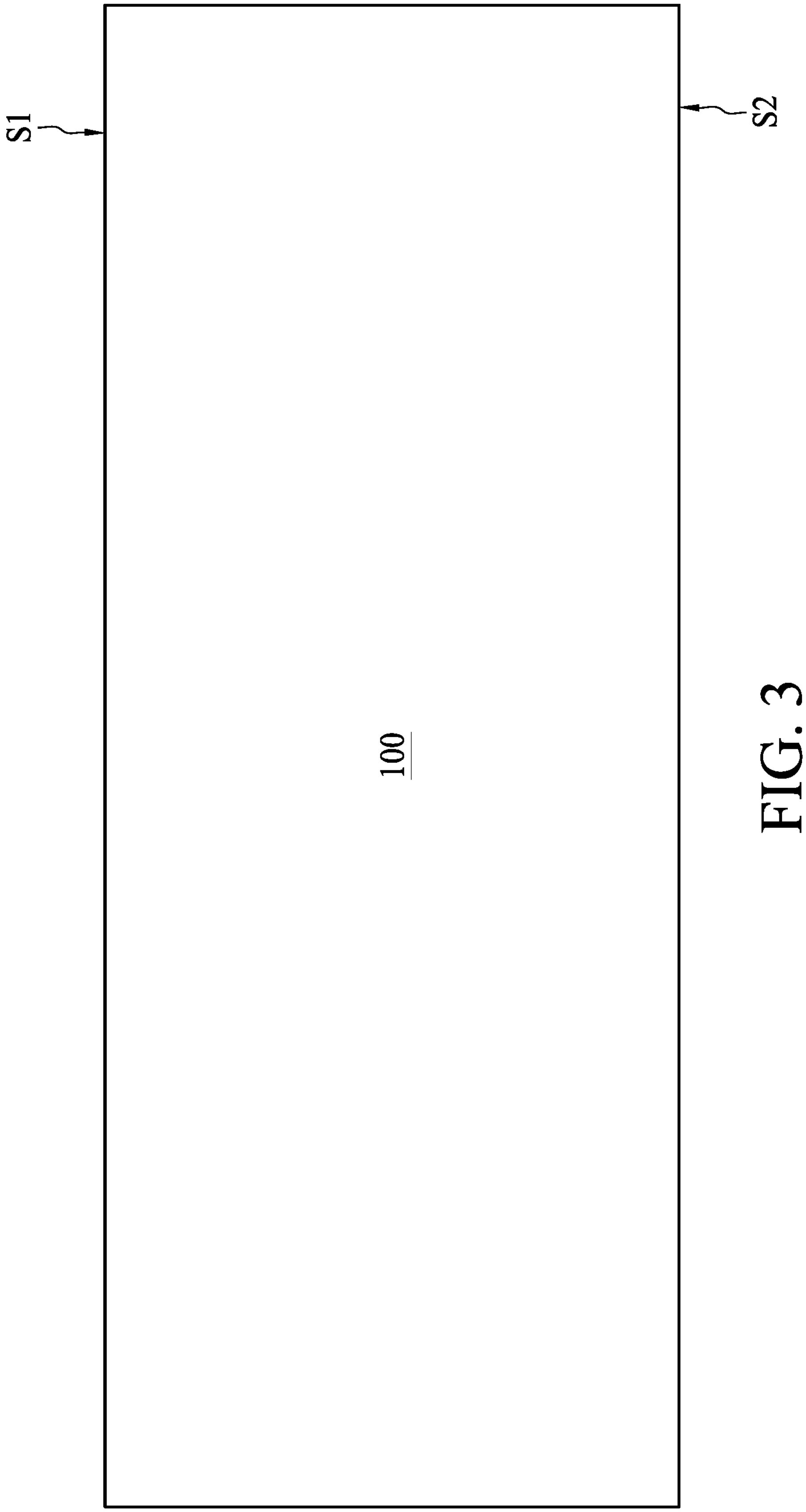
FIGS. 3 to 21 are schematic cross-sectional views illustrating sequential operations of the method shown in FIG. 2, in accordance with some embodiments of the present disclosure.

Referring to operation 201 of FIG. 2, a substrate 100 is provided, as shown in FIG. 3. The substrate has a first surface S1 and a second surface S2 opposite to the first surface S1. The substrate 100 may be a semiconductor substrate such as a silicon substrate. Other materials, such as carbon, germanium, silicon-germanium, gallium, arsenic, nitrogen, indium, phosphorus, and/or the like, may also be included in the semiconductor substrate. In some embodiments, the substrate 100 is a III-V group-on-silicon (such as GaN-on-silicon) substrate, a graphene-on-silicon substrate or a silicon-on-insulator (SOI) substrate. The substrate 100 may form a p-type substrate when P-type dopants such as boron (B), gallium (Ga) and indium (In) ions are doped into the substrate 100. In some embodiments, the first surface S1 of the substrate 100 is an active side. In some other embodiments, the second surface S2 of the substrate 100 is an active side.

Figure 4:
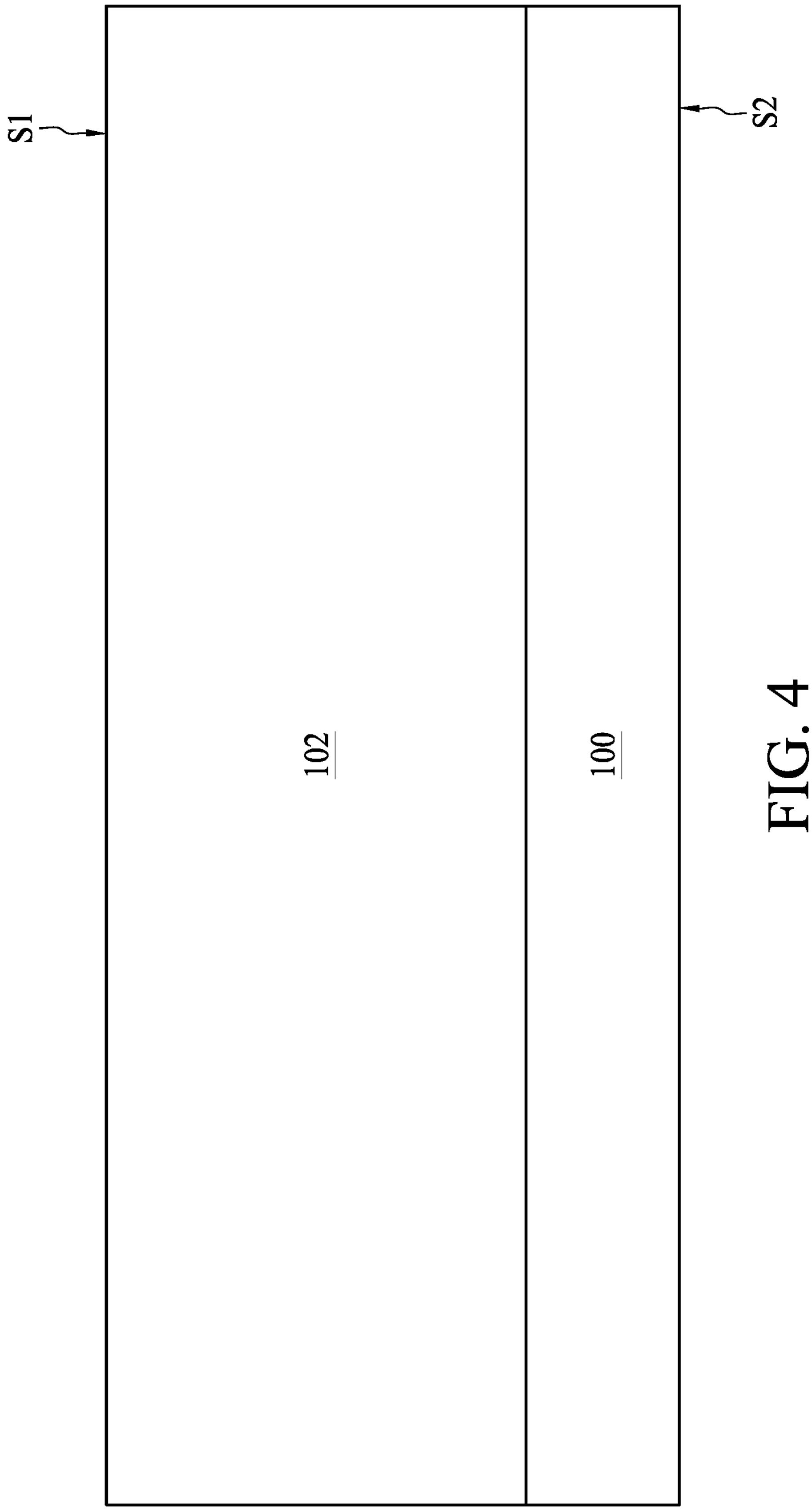

Referring to operation 203 of FIG. 2, a top portion of the substrate 100 is converted to an epitaxial layer 102, as shown in FIG. 4. The epitaxial layer 102 may be formed using an epitaxial growth performed on the substrate 100. As thus, the top portion of the substrate 100 may be converted into the epitaxial layer 102. In some embodiments, the epitaxial layer 102 is a SiGe epitaxial layer. The epitaxial layer 102 may employ germane ($GeH_4$) as a germanium (Ge) source for doping Ge and be grown to a predetermined thickness. A Ge concentration level in the epitaxial layer 102 may gradually increase from about 0% to about 20%. That is, at an initial stage of growth, the Ge concentration level in the epitaxial layer 102 is approximately 0%, and as the growth proceeds, the Ge concentration level in the epitaxial layer 102 gradually increases up to approximately 20%. In some embodiments, the epitaxial layer 102 has a doping profile where the Ge concentration level gradually increases during the epitaxial growth. A furnace annealing operation may be performed on the epitaxial layer 102 after the epitaxial layer 102 is grown. The furnace annealing process is performed in a nitrogen ($N_2$) or hydrogen ($H_2$) atmosphere at a temperature ranging from approximately 800° C. to approximately 1100° C. After the epitaxial layer 102 is formed, the epitaxial layer 102 may have the first surface S1 as its top surface.

Figure 5:
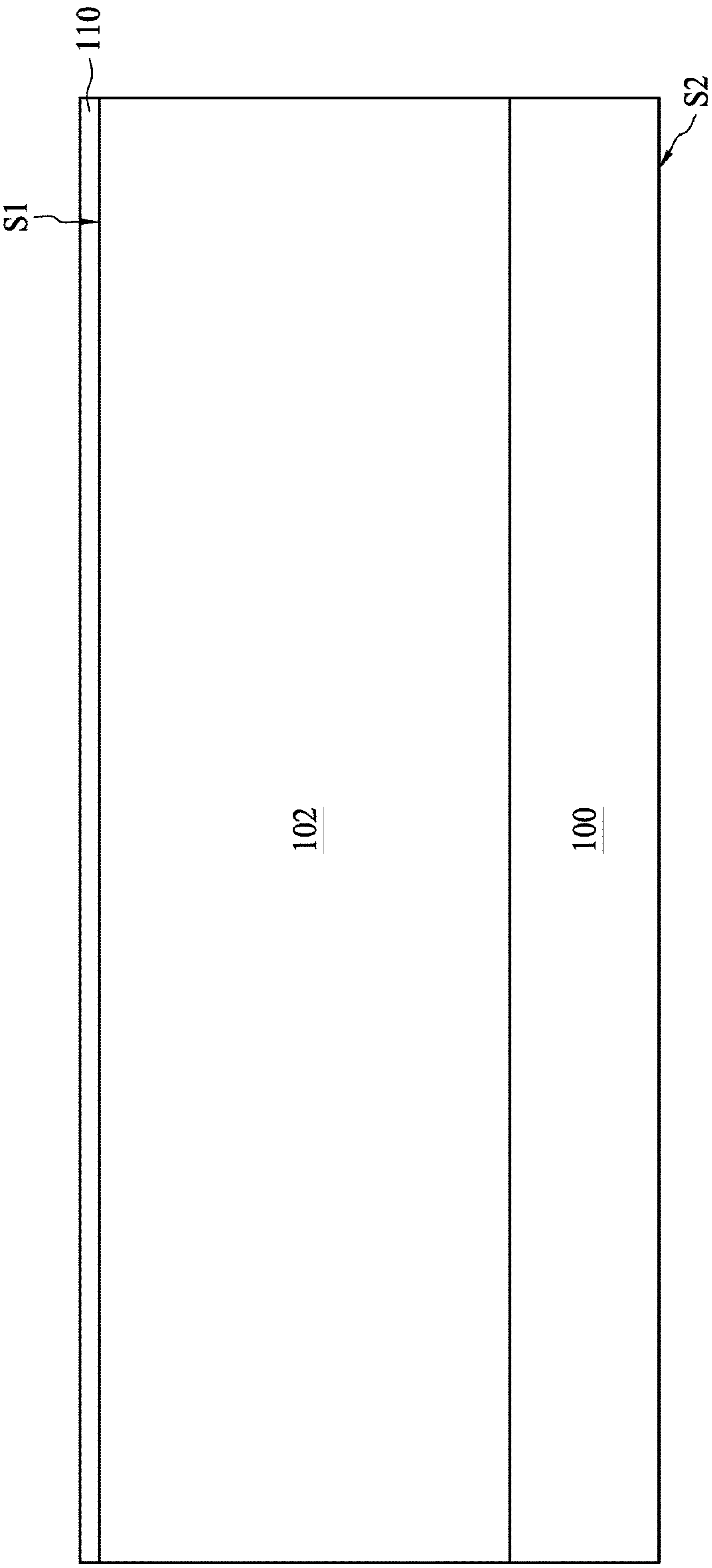

Referring to operation 205 of FIG. 2, a barrier layer 110 is formed on the epitaxial layer 102, as shown in FIG. 5. In some embodiments, the barrier layer 110 is a silicon nitride ($Si_3N_4$) layer. The barrier layer 110 may be formed using a chemical vapor deposition (CVD) operation, for example, by reacting ammonia ($NH_3$) and silane ($SiH_4$) and depositing the formed product over the epitaxial layer 102. The barrier layer 110 may function as a hard mask layer. In some embodiments, a dielectric anti-reflective coating (DARC) layer (not shown) is formed on the barrier layer 110.

Figure 6:
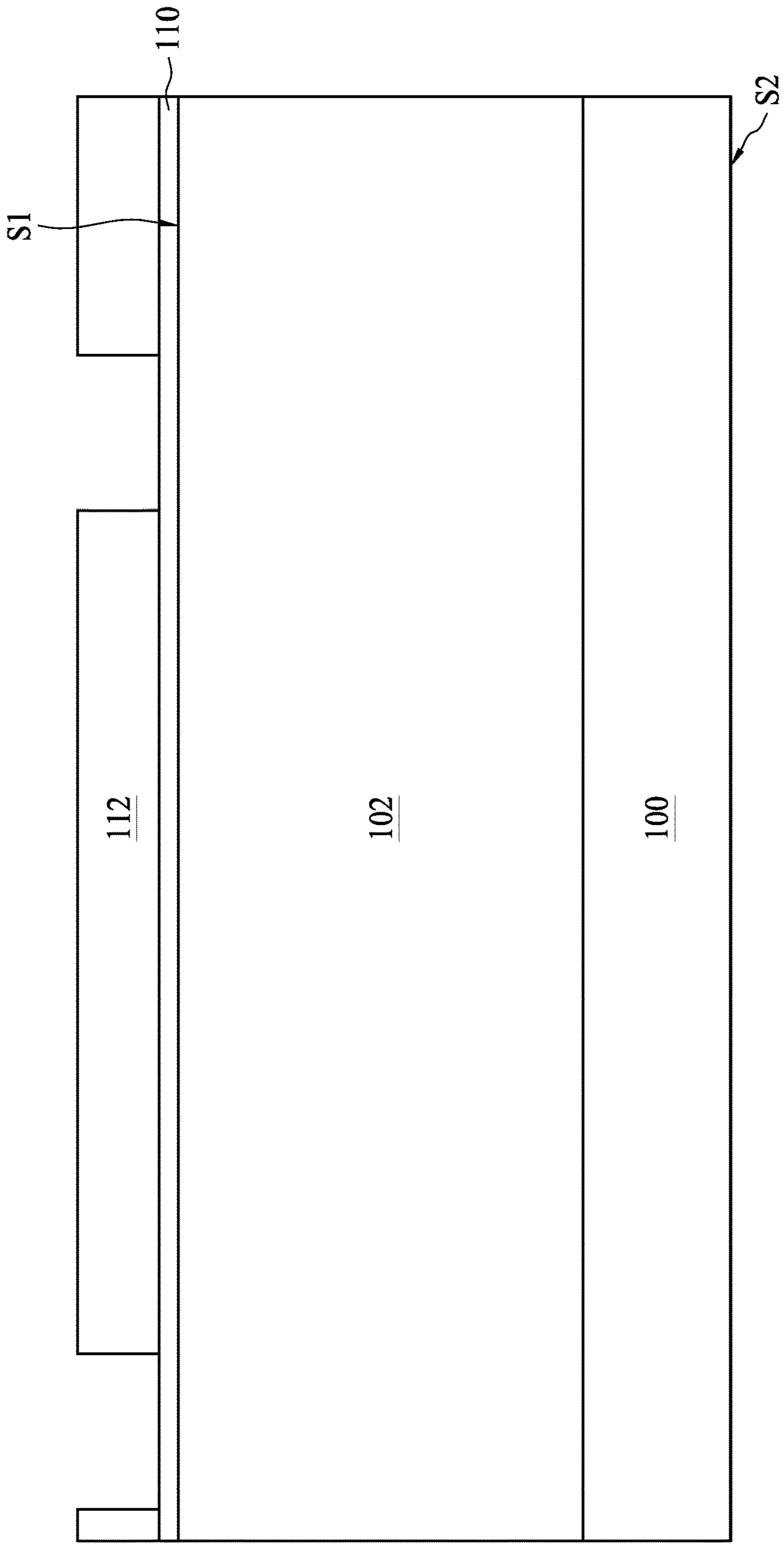
Figure 7:
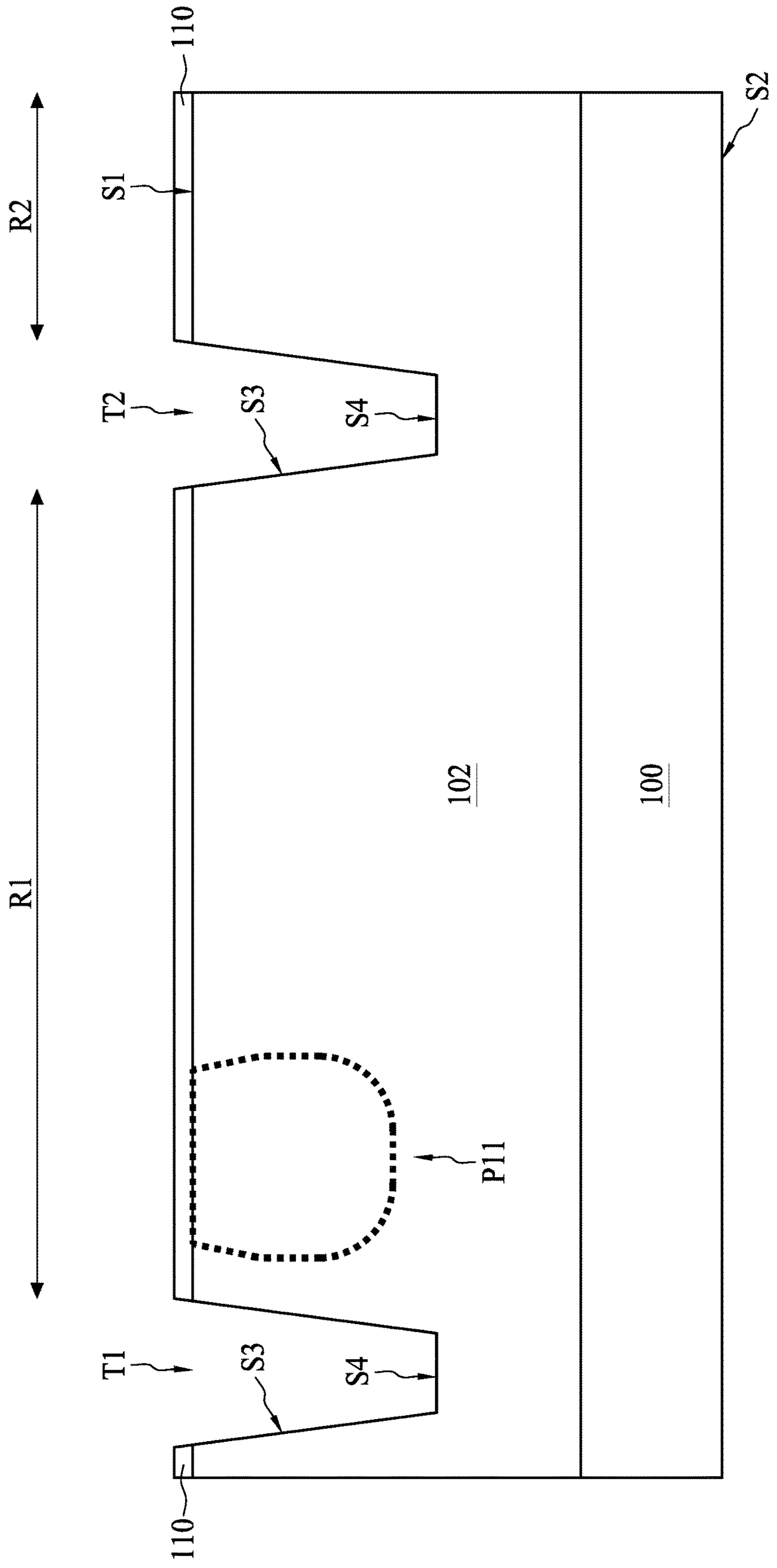

Referring to operation 207 of FIG. 2, trenches T1 and T2 are formed in the epitaxial layer 102, as shown in FIGS. 6 and 7. Referring to FIG. 6, a patterned photoresist layer 112 is formed on the barrier layer 110 and used as an etching mask. In some embodiments, the patterned photoresist layer 112 is used for defining pixel and periphery regions on the substrate 100.

Referring to FIG. 7, an etching operation such as dry etching or reactive ion etching (RIE) is used to recess the barrier layer 110 and the epitaxial layer 102. Such etching operation may utilize plasma condition or difluoromethane/carbon tetrafluoride ($CH_2F_2/CF_4$) chemistry. In some embodiments, the etching operation effectively etches both the barrier layer 110 and the epitaxial layer 102. In some other embodiments, more than one etching operation is used to separately remove the barrier layer 110 and the epitaxial layer 102. The trenches T1, T2 may be formed with a predetermined depth starting from the first surface S1. After the trench etching, the patterned photoresist layer 112 is removed. The etched epitaxial layer 102 may have sidewall surfaces S3 and bottom surfaces S4 exposed by the trenches T1, T2.

Still referring to FIG. 7, in some embodiments, a pixel region R1 used to form a photodiode in the substrate 100 may be defined by the trenches T1 and T2. The trench T2 may separate the pixel region R1 from a periphery region R2 adjacent to the pixel region R1. In some embodiments, a predetermined region P11 in the pixel region R1 is defined in advance for forming the photodiode.

Figure 8:
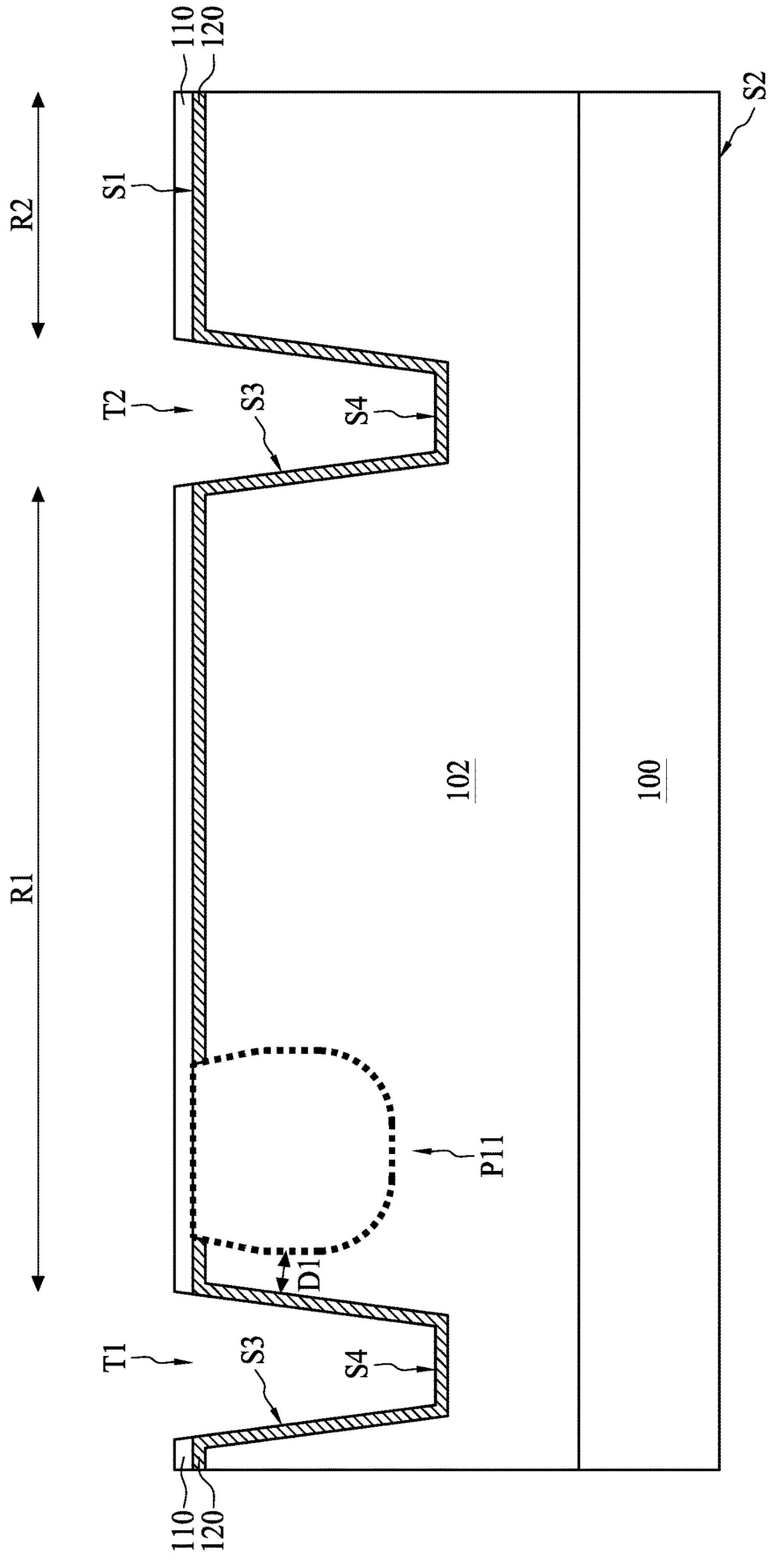

Referring to operation 209 of FIG. 2, a liner layer 120 is formed on the substrate 100, as shown in FIG. 8. In some embodiments, the liner layer 120 is an oxide layer grown on surfaces of the epitaxial layer 102 by thermal oxidization. The silicon (Si) material around the first surface S1, the sidewall surface S3 and the bottom surface S4 of the epitaxial layer 102 may react with oxygen ($O_2$) at a high ambient temperature. As a result, the sidewall surface S3, the bottom surface S4 and top portions of the epitaxial layer 102 facing the barrier layer 110 are oxidized to form the liner layer 120. The formation of the liner layer 120 may consume a top portion of the epitaxial layer 102 (or the substrate 100) to form an oxide layer. In some embodiments, the liner layer 120 in the trenches T1, T2 is used to repair a substrate damage caused by the trench etching operation. In some embodiments, a predetermined first dopant thickness D1 starting from a sidewall of the liner layer 120 facing the predetermined region P11 for forming the photodiode is defined. The predetermined first dopant thickness D1 may be used to limit or decide a maximum range that a doped region formed subsequently can reach.

Figure 9:
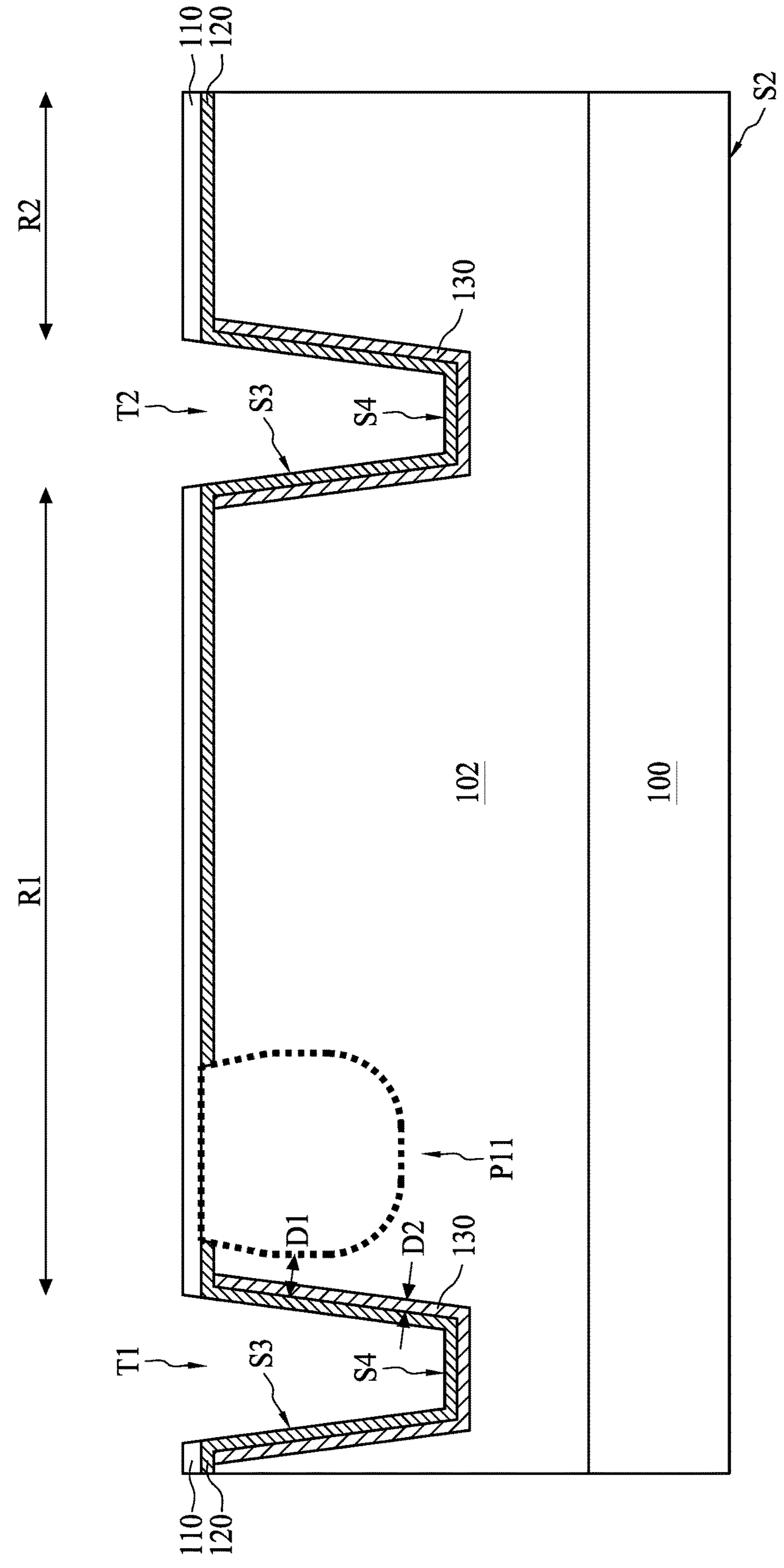

Referring to operation 211 of FIG. 2, portions of the epitaxial layer 102 are ion-implanted, as shown in FIG. 9. In some embodiments, an implant mask (not shown) is formed on the barrier layer 110 without covering the trenches T1, T2. A p-type dopant, such as boron atoms (B) or boron ions ($B^+$), may be implanted into the epitaxial layer 102 through the trenches T1, T2. The boron dopants may penetrate the liner layer 120 and diffuse in the epitaxial layer 102 within the predetermined first dopant thickness D1. In some embodiments, portions of epitaxial layer 102 near the sidewall surfaces S3 and the bottom surfaces S4 form a doped region 130. The doped region 130 may be formed surrounding the trenches T1, T2 and located within the epitaxial layer 102 below the liner layer 120. The implant mask is then removed. In some embodiments, the doped region 130 has a second dopant thickness D2 of about 5 nanometers (nm). The second dopant thickness D2 may be less than the predetermined first dopant thickness D1 such that the doped region 130 does not contact or overlap the predetermined region P11 for forming the photodiode. In some embodiments, the second dopant thickness D2 is no more than one tenth of the predetermined first dopant thickness D1. In some embodiments, the doped region 130 functions as a protective layer around sidewalls of the trenches T1, T2.

Figure 10A:
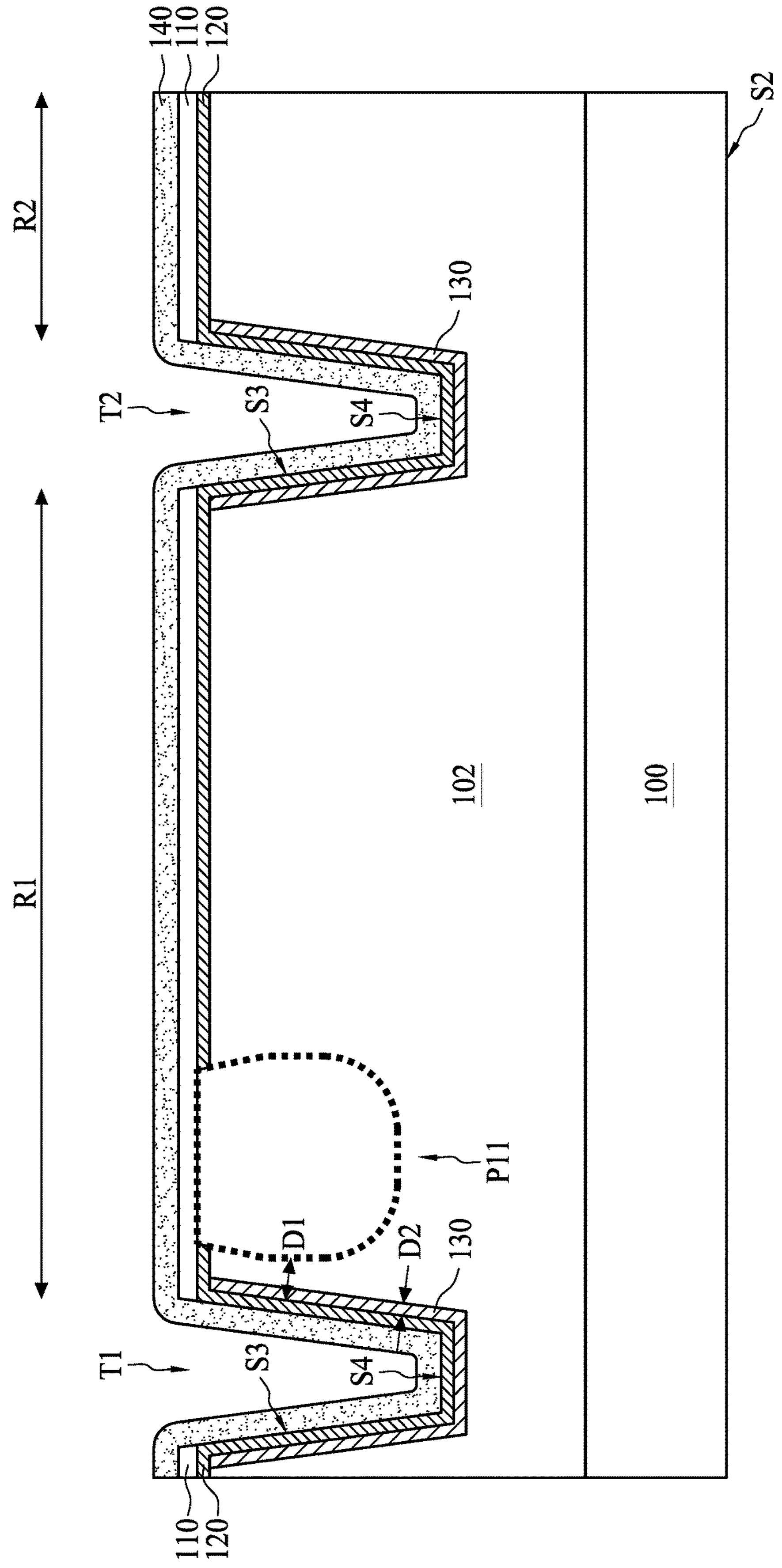

Referring to operation 213 of FIG. 2, a dielectric material is filled into the trenches T1, T2, as shown in FIGS. 10A to 10D. The trenches T1, T2 may be filled with the dielectric material. In some embodiments, the dielectric material is silicon oxide ($SiO_2$) formed using a sub-atmospheric chemical vapor deposition (SACVD) operation such as high-aspect-ratio process (HARP). Due to its formation method, the dielectric material may be referred to as a HARP oxide 140. The formation of the HARP oxide 140 may adopt a multi-stepped deposition approach for filling the trenches T1, T2 without leaving any void therein. Referring to FIG. 10A, ozone ($O_3$) and tetraethyl orthosilicate (TEOS) may be used as process gases for forming the HARP oxide 140. The amount of $O_3$ and TEOS may be adjusted to vary a ratio of oxygen atoms to silicon atoms (O/Si) of the HARP oxide 140. In some embodiments, the formation of the HARP oxide 140 is not based on a reaction between silane and oxygen. The HARP oxide 140 formed as the preliminary stage is a thin oxide film lining the sidewall surfaces S3 and the bottom surfaces S4 within the trenches T1, T2, and surfaces of the barrier layer 110.

Figure 10B:
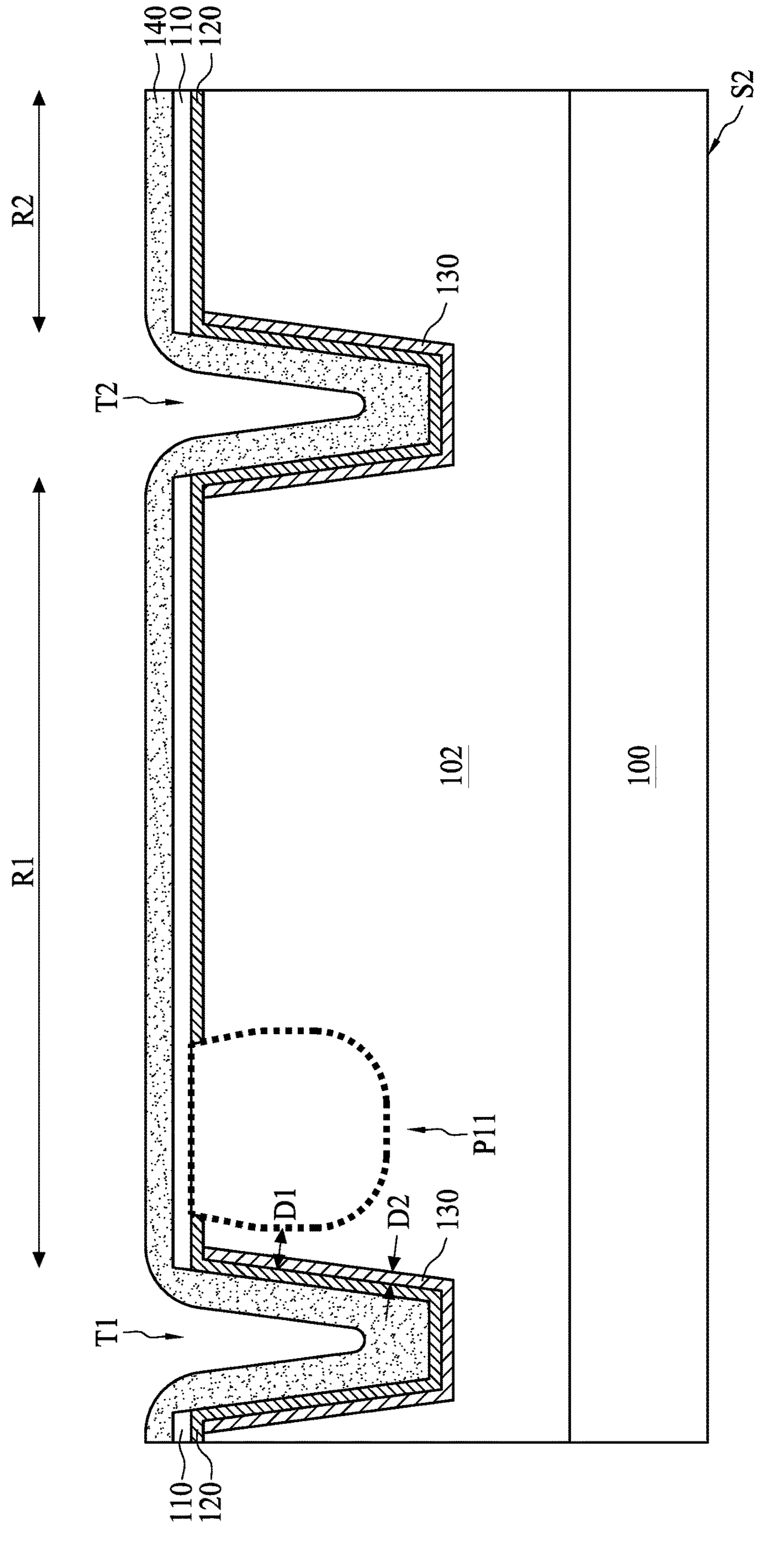

Referring to FIG. 10B, as the deposition proceeds, the HARP oxide 140 gradually becomes thicker. The HARP oxide 140 may still keep substantially conformal within the trenches T1, T2 and on the surface of the barrier layer 110 because the deposition rate of SACVD is low.

Figure 10C:
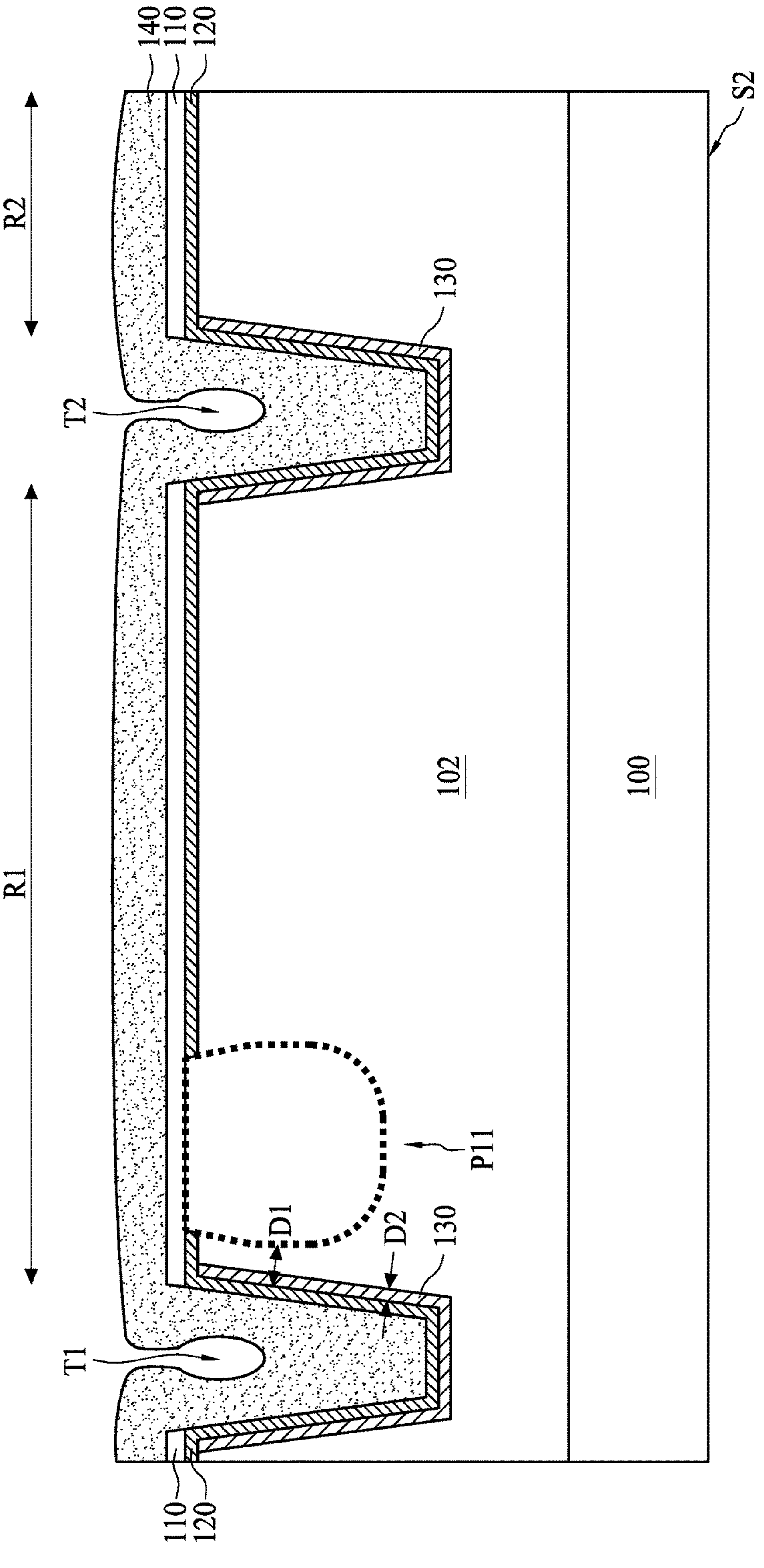

Referring to FIG. 10C, the HARP oxide 140 accumulated at edges of the trenches T1, T2 approaches each other and is about to merge in the middle of the trenches T1, T2.

Figure 10D:
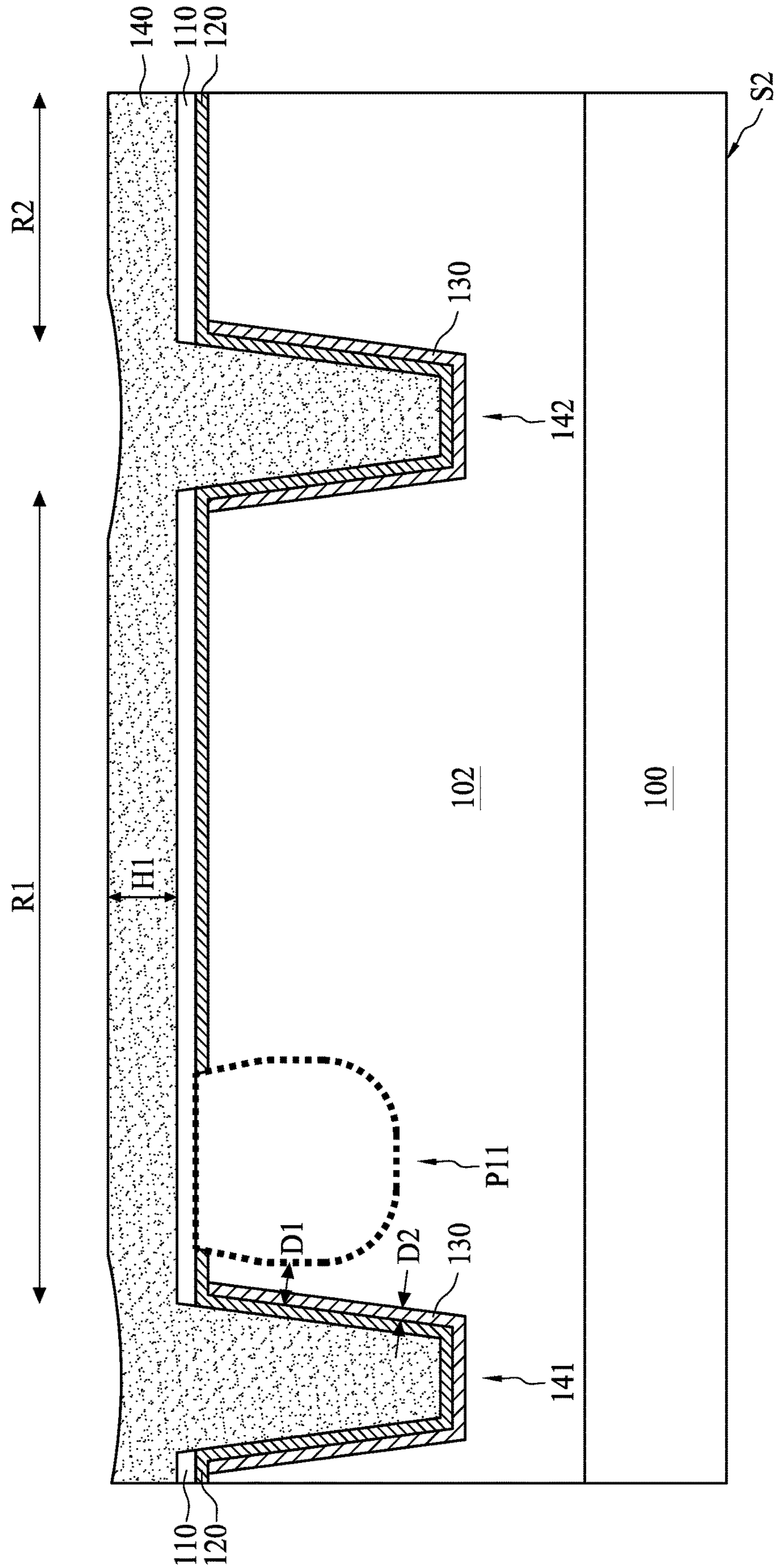

Referring to FIG. 10D, the trenches T1, T2 are completely filled by the HARP oxide 140 and no void is left within the trenches T1, T2. The trenches T1, T2 filled with the HARP oxide 140 may form isolation features 141, 142 on the substrate 100. The HARP oxide 140 over the top surface of the barrier layer 110 may have a first thickness H1 when the trenches T1, T2 are filled. In some embodiments, each of the isolation features 141 and 142 is surrounded by the doped region 130 in the substrate 100. The doped region 130 may extend below the isolation features 141, 142.

Other isolation features may be formed on the substrate 100, and not all of them are illustrated. In some embodiments, the isolation features 141, 142 are shallow trench isolations (STIs) used to separate and isolate photodiodes formed in subsequent operations. The isolation features 141, 142 may be used to separate NMOS and PMOS devices subsequently formed in the pixel region R1 or the periphery region R2. The isolation features 141, 142 may also function as junction isolations for isolating active elements.

When manufacturing a CMOS image sensor (CIS), any possibility that might lead to a dark current generated from a photodiode should be avoided. The dark current is known to cause blemished pixels which are called white spot defects. In some embodiments, the HARP oxide 140 of the present disclosure is not formed using a plasma-based technique. Any plasma-based technique may use a plasma to bombard a portion of an STI structure and thus creates surface defects, for example, on a sidewall of the STI structure, the surface defects may become a source that causes a dark current. In some embodiments, the formation of the isolation features 141, 142 uses the SACVD operation (HARP), which is a non-plasma-based technique. The HARP can prevent any damage resulted from plasma and meet a stringent gap-fill requirement of shallow trench isolation (STI) structures. The sidewall surface S3 and the bottom surface S4 of the epitaxial layer 102 which are previously repaired by the liner layer 120 may not be harmed.

Figure 11A:
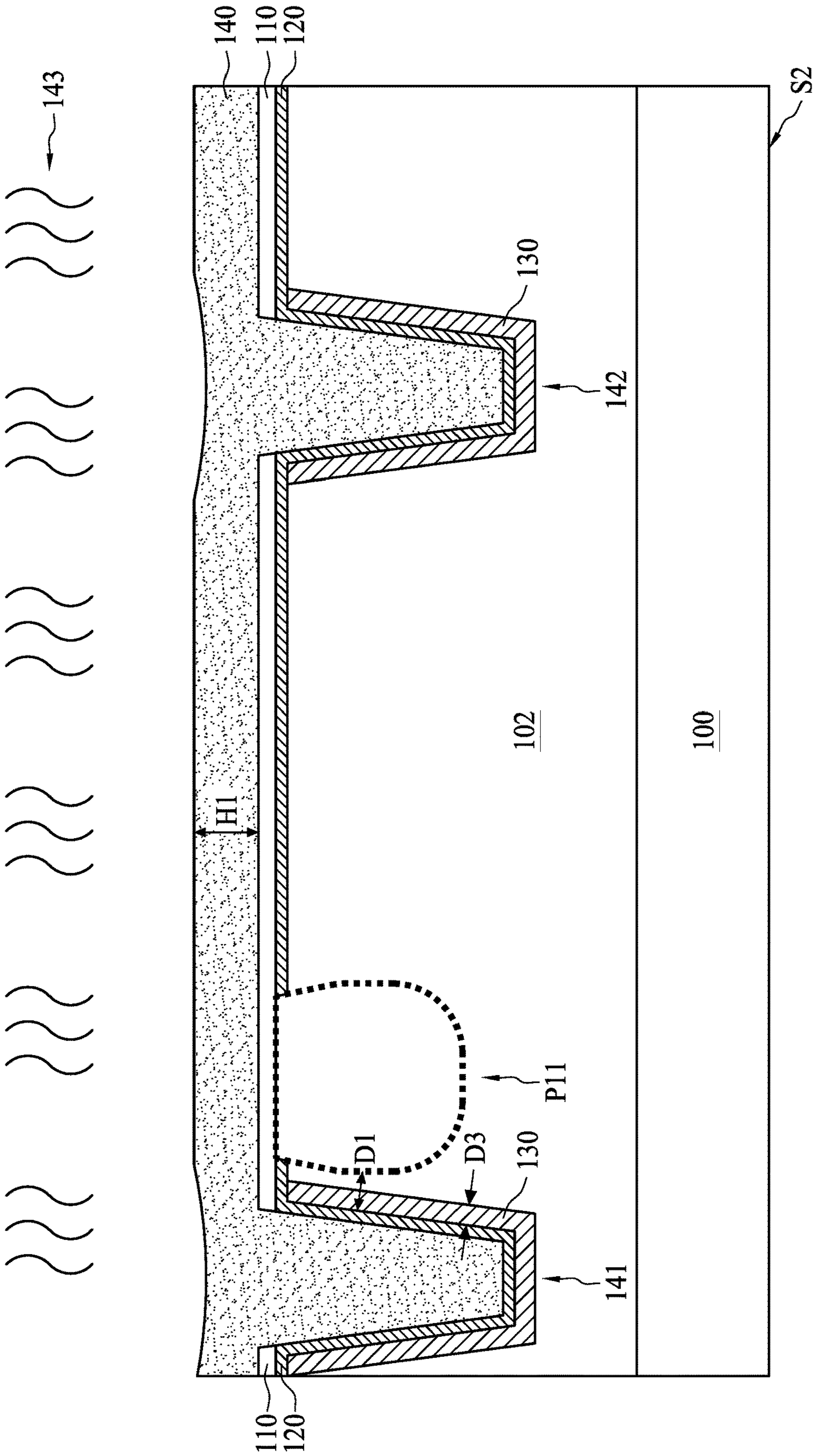
Figure 11B:
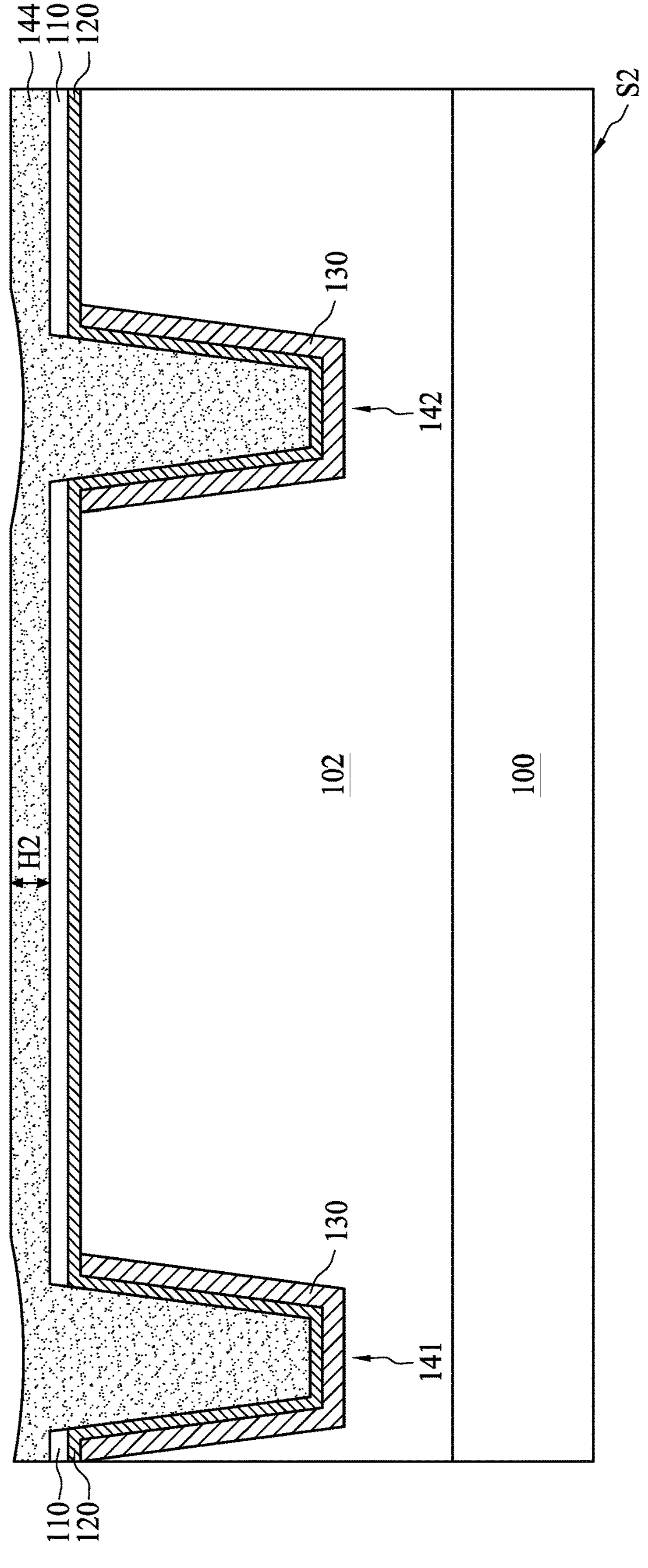

Referring to operation 215 of FIG. 2, an annealing treatment 143 is performed on the HARP oxide 140, as shown in FIGS. 11A and 11B. The HARP oxide 140 formed using SACVD may not be compact enough and requires a thermal treatment for densification. Referring to FIG. 11A, in some embodiments, an in-situ steam generation (ISSG) chamber is used for annealing treatment 143. An ISSG technique is one kind of rapid thermal annealing (RTA) operation, which can heat the HARP oxide 140 in a short period and bring about low thermal budget. In some embodiments, the HARP oxide 140 is subjected to a temperature range of about 950° C. to about 1050° C. with duration of about 5 seconds to about 30 seconds. The short duration is enough to densify the HARP oxide 140. In some embodiments, the HARP oxide 140 is subjected to a pressure range of about 1 torr to about 10 torr. During the annealing treatment 143, moistures may be removed and stress generated in the HARP oxide 140 can be lessened, thus improving the density of the HARP oxide 140. Further, in the present disclosure, the annealing treatment 143 is used for densifying the HARP oxide 140, rather than performing an oxidation operation. In such embodiments, only nitrogen ($N_2$) is introduced to the ISSG chamber. During the annealing treatment 143, boron dopants in the doped region 130 may diffuse or expand as a result of heat and its thickness is increased accordingly. In some embodiments, after the annealing treatment 143, the doped region 130 expands from the second dopant thickness D2 to a third dopant thickness D3 that is less than the predetermined first dopant thickness D1. The doped region 130 may be still kept spaced from the predetermined region P11 for forming the photodiode. In some embodiments, the third dopant thickness D3 is about 50 nm. The third dopant thickness D3 may be less than ten times of the second dopant thickness D2. That is, dopants of the doped region 130 (protective layer) may expand in thickness by less than ten times.

Referring to FIG. 11B, after the annealing treatment 143, the HARP oxide 140 becomes more compact and turns into a densified HARP oxide 144. The densified HARP oxide 144 over the top surface of the barrier layer 110 may have a second thickness H2. In some embodiments, the second thickness H2 is less than the first thickness, which shows a shrinkage of the HARP oxide 140. In some embodiments, the densified HARP oxide 144 has a second density greater than a first density of the HARP oxide 140. In order to prevent dopants in the doped region 130 from diffusing or spreading into adjacent areas and causing adverse effects to adjacent elements, the annealing treatment 143 does not use a furnace-based technique so as to keep the thickness of the annealed doped region 130 within a predetermined value. Furnace tubes usually take several minutes to heat up to a predetermined temperature. Besides, since furnace anneals are generally used for batches of semiconductor wafers at a time, each processing cycle for a furnace may last for several hours or days. Such a relatively long thermal cycle of a furnace may cause dopants in the semiconductor wafers to be activated and diffuse farther than is intended. In some cases, if a furnace-based technique is used to densify the HARP oxide 140, the doped region 130 after the annealing treatment may be thickened to a thickness of about 150 nm.

In some embodiments, the annealing treatment 143 of the present disclosure uses a short duration but still effective enough to densify the HARP oxide 140. The annealing treatment 143 may not make the boron dopants in the doped region 130 diffuse significantly because the annealing treatment 143 only lasts about 5 seconds to about 30 seconds. In some embodiments, a maximum thickness of the doped region 130 after the annealing treatment 143 is less than 50 nm. That is, a thickness range where the boron dopants spread is less than 50 nm.

Figure 12:
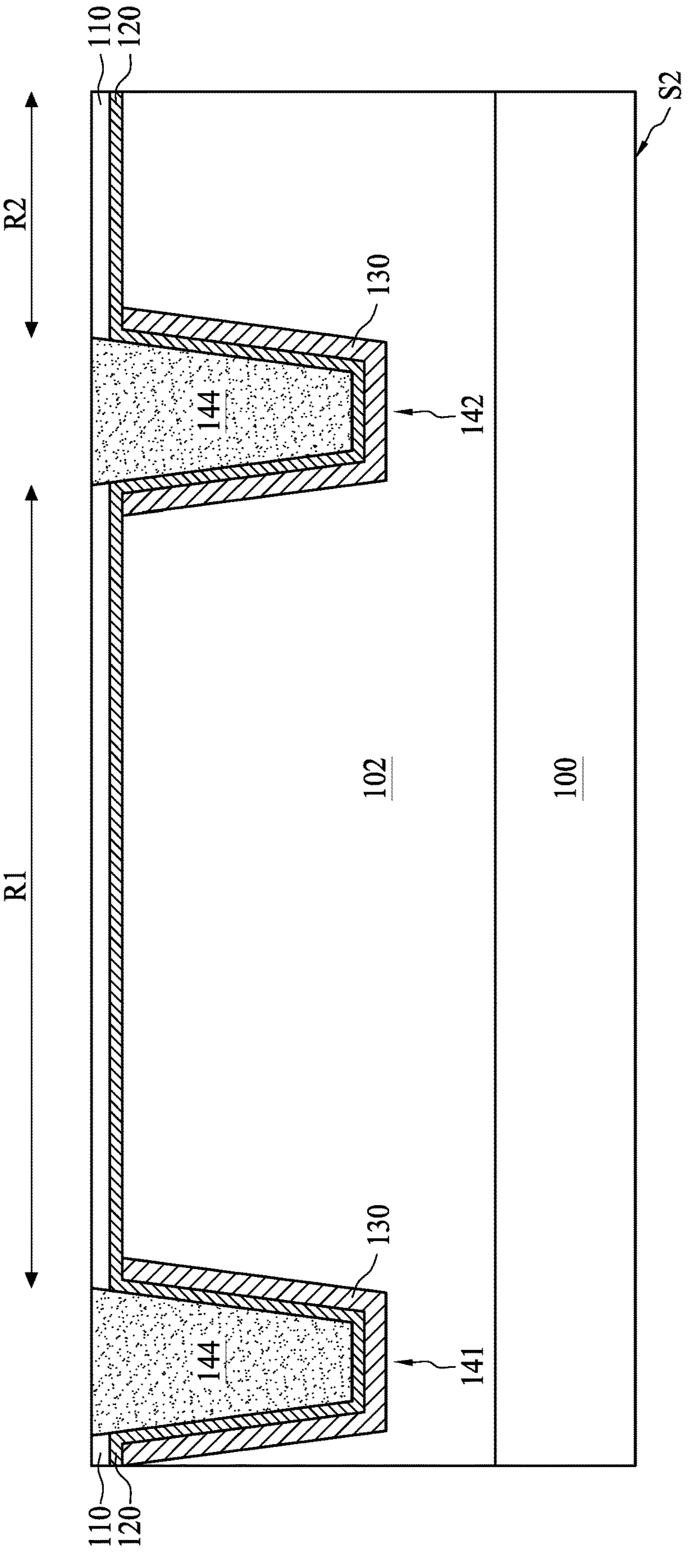

Referring to operation 217 of FIG. 2, a chemical mechanical polishing (CMP) operation is performed, as shown in FIG. 12. In some embodiments, the CMP operation is used to remove excess densified HARP oxide 144 over the barrier layer 110. In some cases, if the HARP oxide 140 is not annealed, it may not be compact enough and some of the HARP oxide 140 within the trenches T1, T2 may be lost after the CMP operation.

Figure 13:
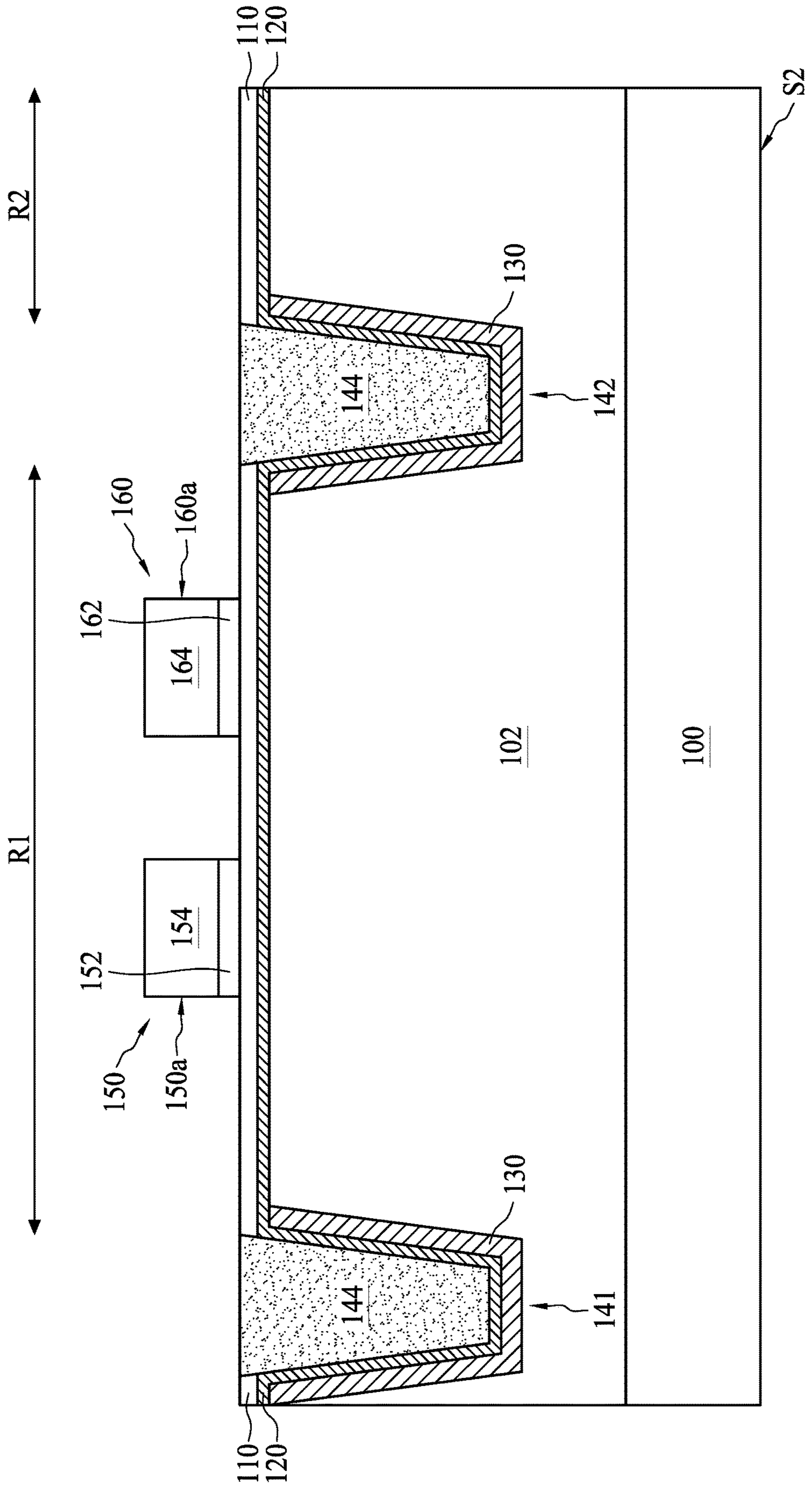

Referring to operation 219 of FIG. 2, a transfer transistor 150 and a reset transistor 160 are formed on the substrate 100, as shown in FIG. 13. For forming the transfer transistor 150 and the reset transistor 160, insulating layers 152 and 162 are deposited on the barrier layer 110. The insulating layers 152, 162 may be silicon oxide or a high dielectric-constant (high k) material. The insulating layers 152, 162 may be formed using CVD, ISSG or other suitable operations. The insulating layer 152 and the insulating layer 162 serve as a gate dielectric layer for the transfer transistor 150 and the reset transistor 160, respectively. Next, conductive layers 154 and 164 are respectively deposited on the insulating layers 152 and 162. In some embodiments, the conductive layers 154, 164 are polysilicon when the insulating layers 152, 162 are silicon oxide. In some other embodiments, the conductive layers 154, 164 are metals when the insulating layers 152, 162 are high k materials. The conductive layers 154, 164 may be formed using a CVD operation such as low pressure CVD (LPCVD), plasma enhanced CVD (PECVD) or other suitable operations. In some embodiments, the conductive layers 154, 164 are doped in situ, during deposition, via the addition of arsine (As) or phosphine (P), to a silane ($SiH_4$) ambient. In some other embodiments, the conductive layers 154, 164 are deposited intrinsically, and subsequently doped via implantation of arsenic or phosphorous ions to have an N conductivity type. The conductive layer 154 and the conductive layer 164 serve as a gate electrode for the transfer transistor 150 and the reset transistor 160, respectively.

Still referring to FIG. 13, the insulating layer 152 and the conductive layer 154 may make up the transfer transistor 150, and the insulating layer 162 and the conductive layer 154 may make up the reset transistor 160. However, additional layers may be added to the transfer and reset transistors 150, 160. For example, a silicide layer (not shown) may be formed on the conductive layer 154. The silicide layer may be titanium silicide, tungsten silicide, cobalt silicide, molybdenum silicide, tantalum silicide, or other suitable materials. A barrier layer/refractor metal (not shown), such as titanium nitride/tungsten (TiN/W), tungsten nitride/tungsten ($WN_x$/W), or entirely of tungsten nitride ($WN_x$) may be additionally formed on the transfer and reset transistors 150, 160. The transfer transistor 150 has a sidewall 150*a* including a surface of the insulating layer 152 and a surface of the conductive layer 154. The reset transistor 160 has a sidewall 160*a* including a surface of the insulating layer 162 and a surface of the conductive layer 164. Although not shown, other transistors or logic elements may be disposed in the periphery region R2 on the substrate 100. These logic elements may be formed concurrently with the transfer and reset transistors 150, 160.

Figure 14A:
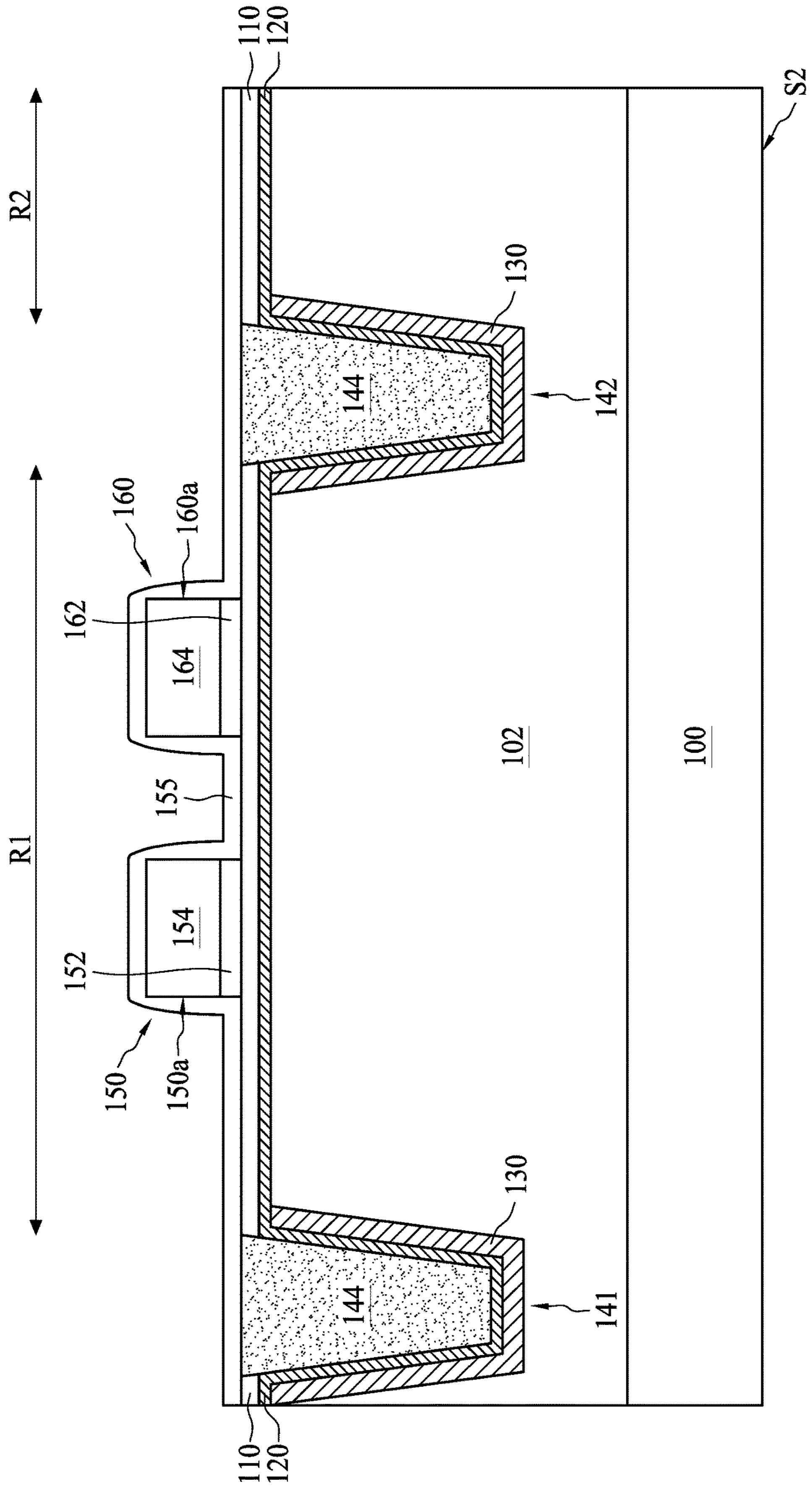
Figure 14B:
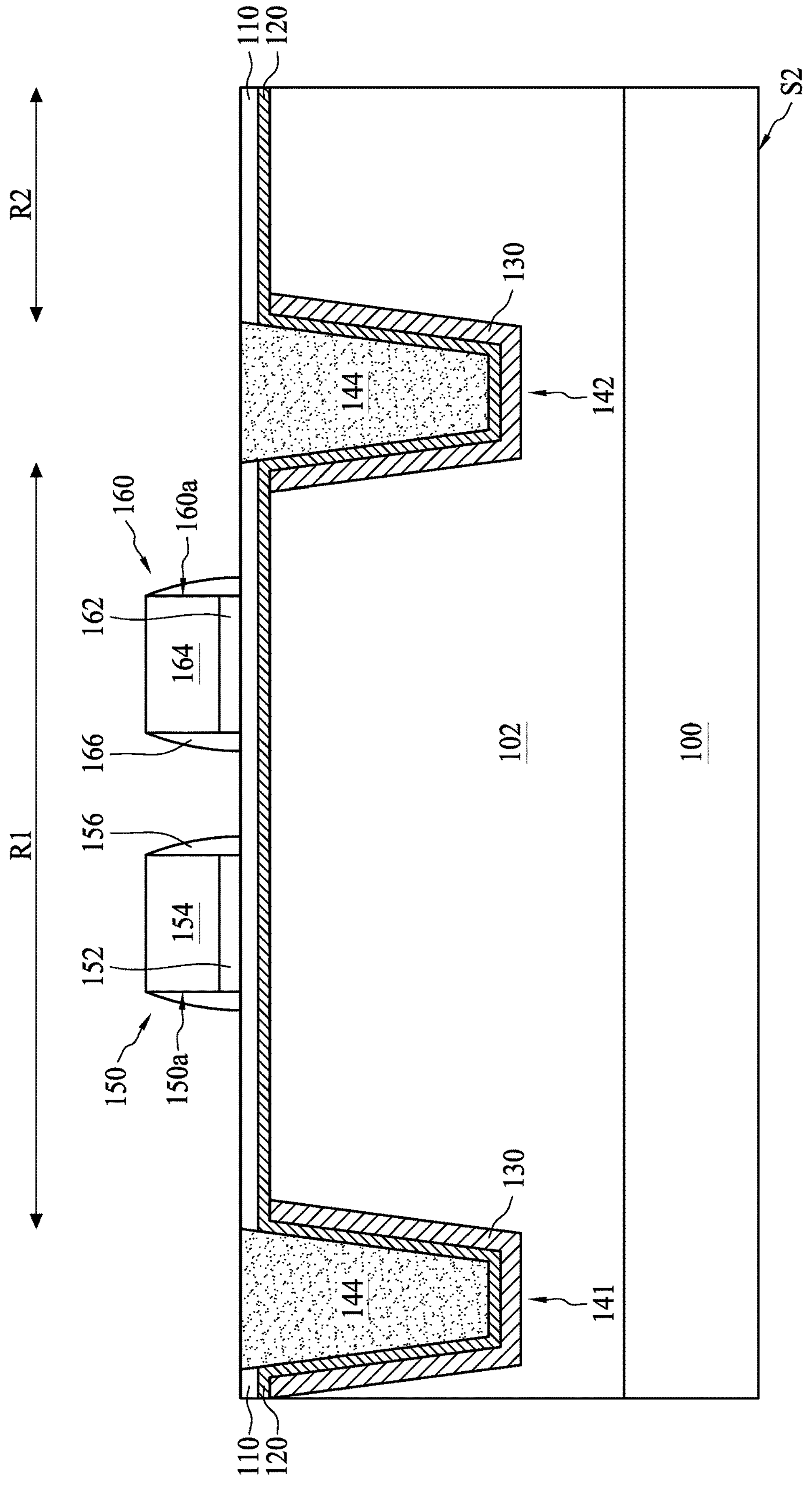

Referring to operation 221 of FIG. 2, a spacer 156 is formed to surround the transfer transistor 150 and a spacer 166 is formed surround to the reset transistor 160, as shown in FIGS. 14A and 14B. Referring to FIG. 14A, a dielectric material 155 is deposited over the isolation features 141, 142, the photodiode P1, the transfer transistor 150, the reset transistor 160, the floating diffusion region 180, the source/drain region 182 and the barrier layer 110. The dielectric material 155 may be formed using LPCVD, PECVD or other suitable operations. The dielectric material 155 may be silicon oxide, silicon nitride or a combination such as nitride-oxide-nitride.

In some embodiments, a predetermined region P11 for forming the photodiode P1 (as shown in FIGS. 7 and 8) is defined prior to the formation of the doped region 130. The position of the photodiode P1 is designed to be adjacent to the isolation features 141 in the pixel region R1. The doped region 130 is expected to not overlap the n-type doped region 184 as much as possible, so as not to reduce the charge capacity of the photodiode P1. In some embodiments, after the annealing of the HARP oxide 140, the diffused boron dopants in the doped region 130 are kept separated from the predetermined region P11 for forming the photodiode P1.

Referring to FIG. 14B, a patterned photoresist layer (not shown) may be used to cover portions of the dielectric material 155 and expose the dielectric material 155 over the sidewalls 150*a* and 160*a*. The dielectric material 155 is then etched using the patterned photoresist layer as an etching mask. The remained dielectric material 155 forms a sidewall spacer 156 on the sidewall 150*a* of the transfer transistor 150 and a sidewall spacer 166 on the sidewall 160*a* of the reset transistor 160.

Figure 15:
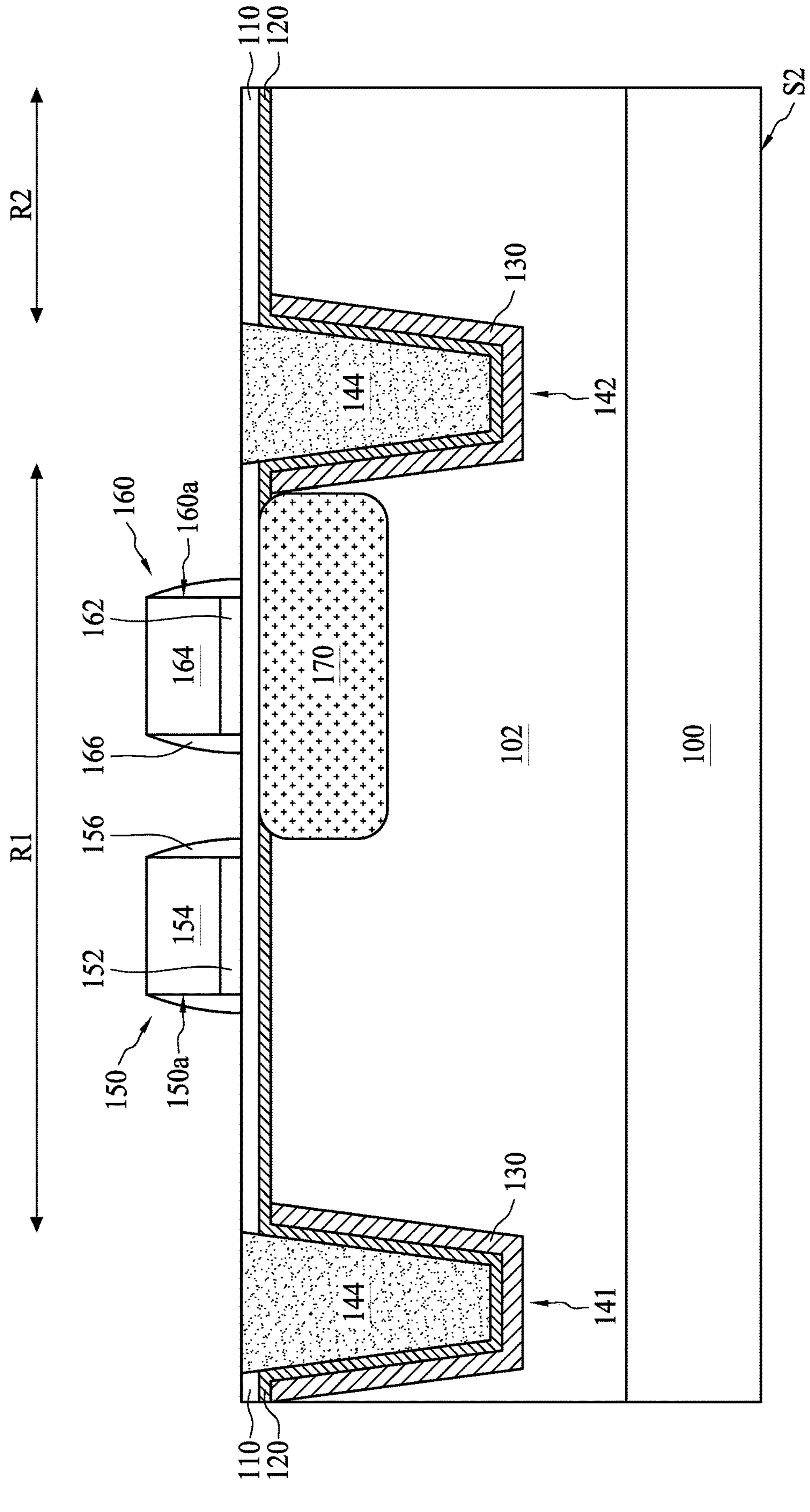

Referring to operation 223 of FIG. 2, a p-type well 170 is formed in the substrate 100, as shown in FIG. 15. In some embodiments, an implantation operation is performed on a portion of the epitaxial layer 102 below the reset transistor 160 and extending in a direction away from where a photodiode is to be formed in the substrate 100. An implant mask (not shown) can be patterned over the substrate 100 having an opening over the area where the P well 170 is to be formed. A p-type dopant, such as boron, can be implanted into the substrate 100 through the opening in the implant mask. The P well 170 is formed having a p-type dopant concentration that is higher than adjacent portions of the epitaxial layer 102. In some other embodiments, the P well 170 is formed prior to the formation of the transfer and reset transistors 150, 160.

Figure 16:
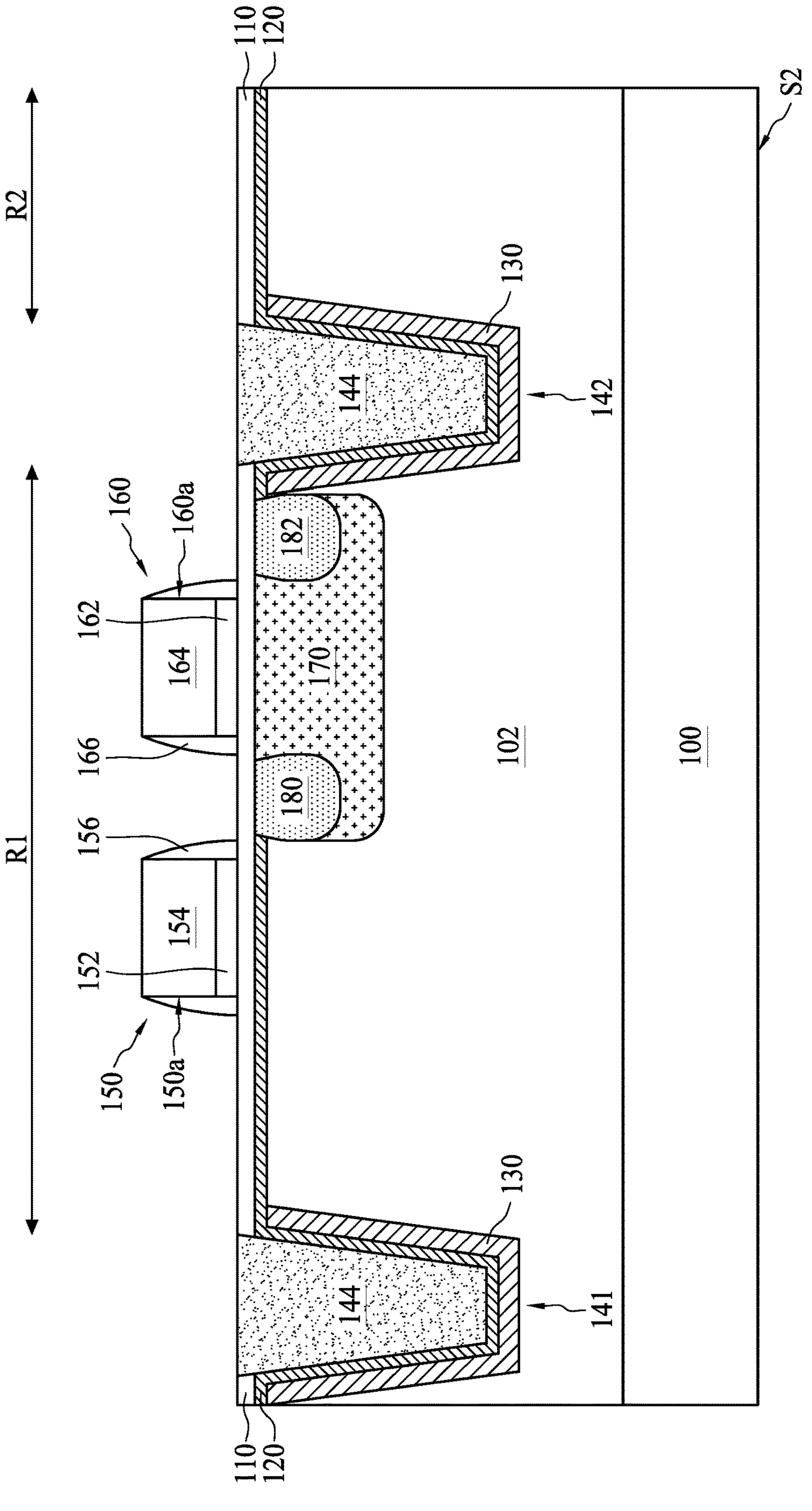

Referring to operation 225 of FIG. 2, a floating diffusion region 180 and a source/drain region 182 are formed in the substrate 100, as shown in FIG. 16. In some embodiments, an implantation operation is performed on portions of the p-type well 170 that are not covered by the reset transistor 160. An implant mask (not shown) can be patterned over the substrate 100 having openings over the area where the floating diffusion region 180 and the source/drain region 182 are to be formed. The floating diffusion region 180 and the source/drain region 182 are formed as n-type regions. An n-type dopant, such as phosphorus, arsenic, or antimony, may be used to form the n-type regions. In some embodiments, the spacers 156, 166 are used for defining an area of the floating diffusion region 180 or the source/drain region 182. The floating diffusion region 180 may be formed between the transfer transistor 150 and the reset transistor 160. In some embodiments, the source/drain region 182 is formed on one side of the reset transistor 160 opposite to the floating diffusion region 180. In some embodiments, the transfer transistor 150 transfers charges gathered in the photodiode P1 to the floating diffusion region 180. In some embodiments, the reset transistor 160 is used for discharging the charges in the floating diffusion region 180 by setting an electric potential thereon during reset. The reset transistor 160 may periodically reset the charges stored in the floating diffusion region 180

Figure 17:
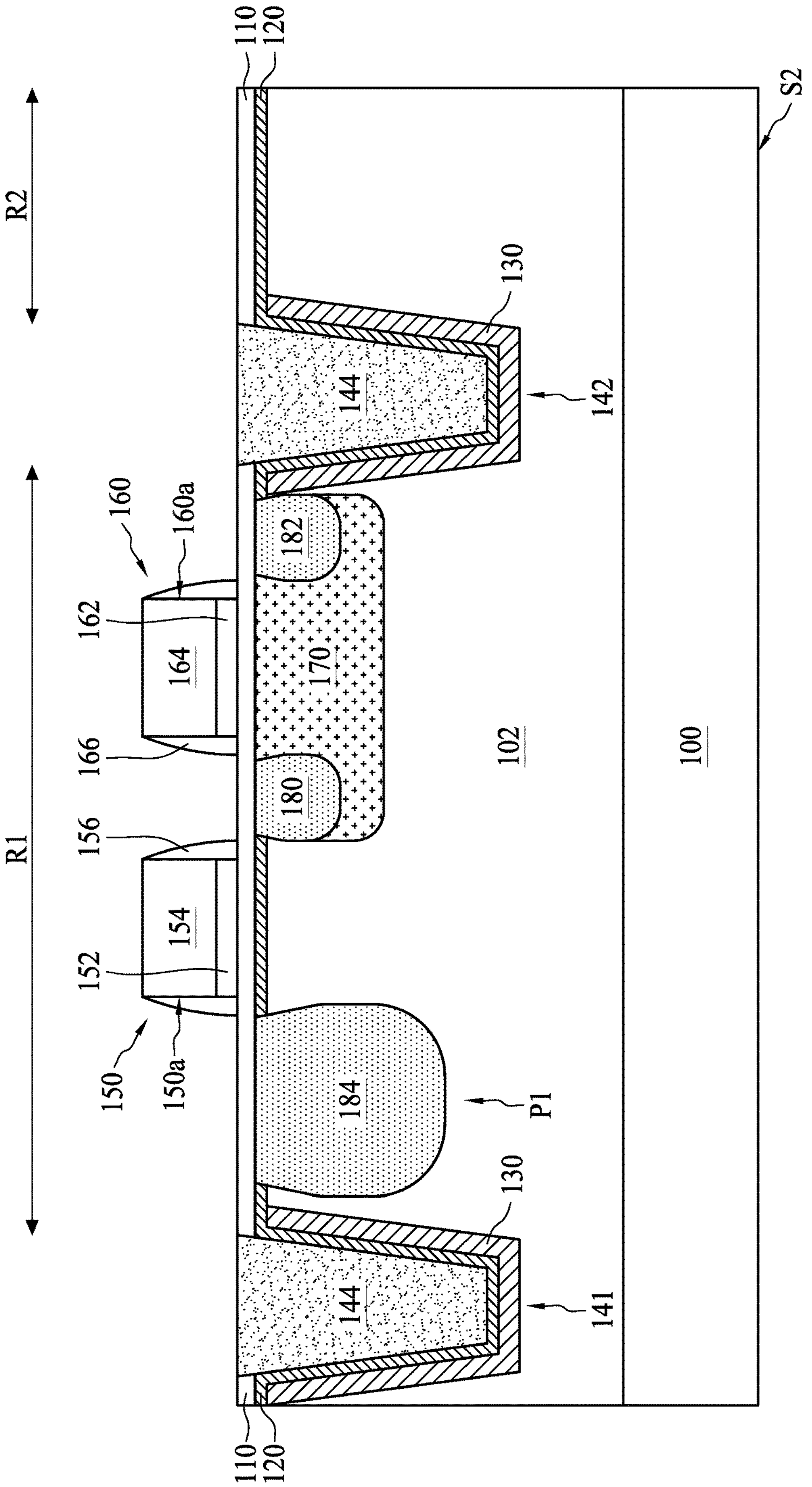

Referring to operation 227 of FIG. 2, an n-type doped region 184 is formed in the substrate 100, as shown in FIG. 17. The n-type doped region 184 is a region where a photodiode P1 is to be formed. In some embodiments, after the floating diffusion region 180 and the source/drain region 182 are formed, an implantation operation is performed on a portion of the epitaxial layer 102 between the isolation feature 141 and the transfer transistor 150. The n-type doped region 184 may be formed on one side of the transfer transistor 150 opposite to the floating diffusion region 180. An implant mask (not shown) can be patterned over the substrate 100 having an opening over the area where the n-type doped region 184 is to be formed. An n-type dopant, such as phosphorus, arsenic, or antimony, can be implanted into the substrate 100 through the opening in the implant mask. Multiple implants may be used to tailor the profile of the n-type doped region 184. If desired, an angled implantation may be conducted to form the n-type doped region 184, whereby the implantation is carried out at angles other than 90 degrees relative to the surface of the substrate 100. In some embodiments, the n-type doped region 184 and the floating diffusion region 180 or the source/drain region 182 are formed intrinsically. In some other embodiments, the n-type doped region 184 can be formed concurrently with the floating diffusion region 180 and the source/drain region 182. In some embodiments, an interface between the n-type doped region 184 and the p-type epitaxial layer 102 (or substrate 100) form a photosensitive charge accumulating region for collecting photo-generated charges. The charge accumulating region may also be referred to as a space charge region or a depletion region.

Figure 18:
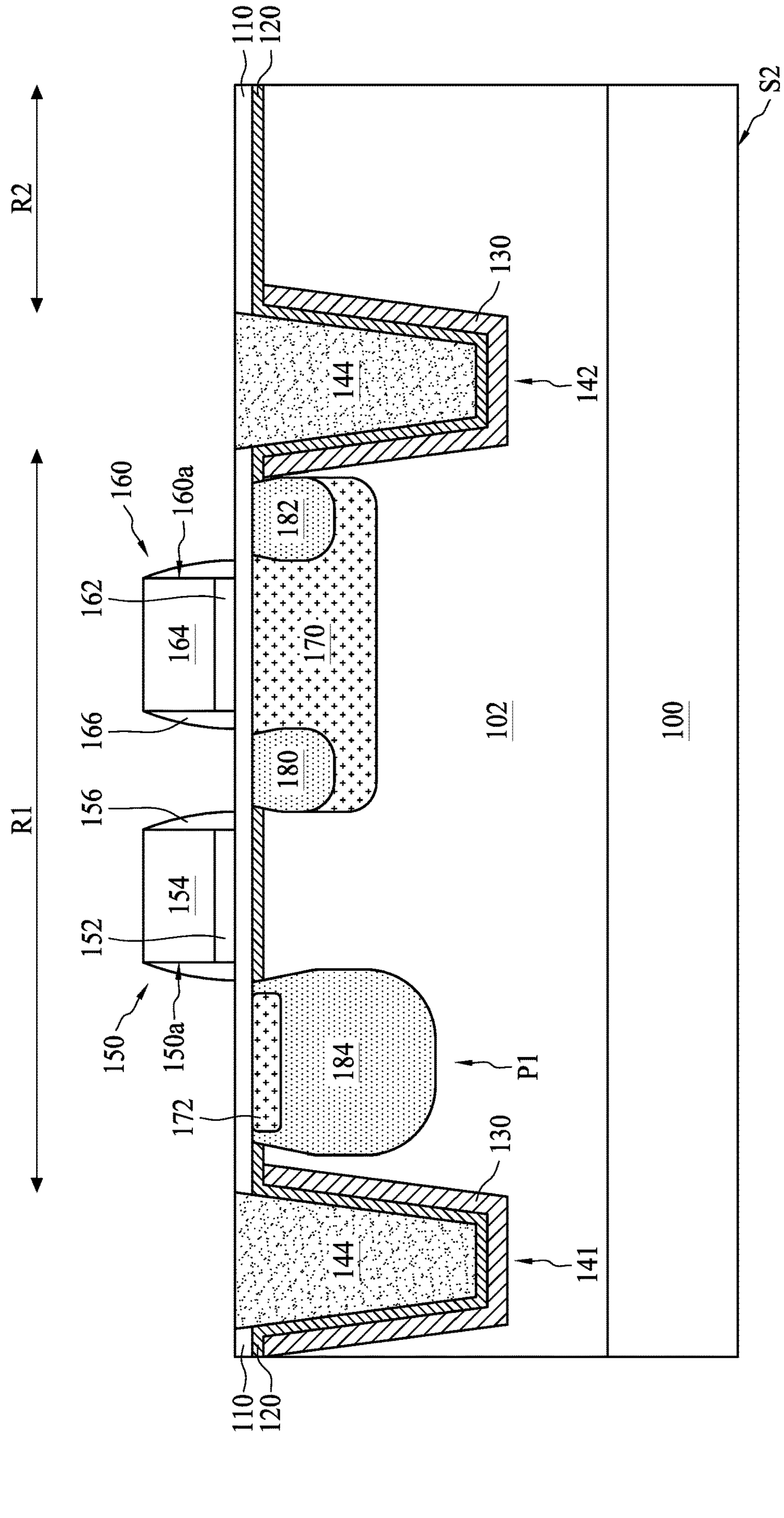

Referring to operation 229 of FIG. 2, a p-type pinned region 172 is formed in the substrate 100, as shown in FIG. 18. In some embodiments, an implantation operation is performed on a top portion of the n-type doped region 184 between the isolation feature 141 and the transfer transistor 150. An implant mask (not shown) can be patterned over the substrate 100 having an opening over the area where the p-type pinned region 172 is to be formed. A p-type dopant, such as boron, indium, or any other suitable p-type dopant, may be implanted into the substrate 100 through the opening in the implant mask. The p-type pinned region 172 may be formed as a highly doped p-type surface layer having a depth of about 0.1 micrometer (um). Therefore, a P-N junction may be formed at an interface between the p-type pinned region 172 and the n-type doped region 184. In some embodiments, the p-type pinned region 172 and the n-type doped region 184 form the photodiode P1 used for transforming photons into electrons.

Figure 19:
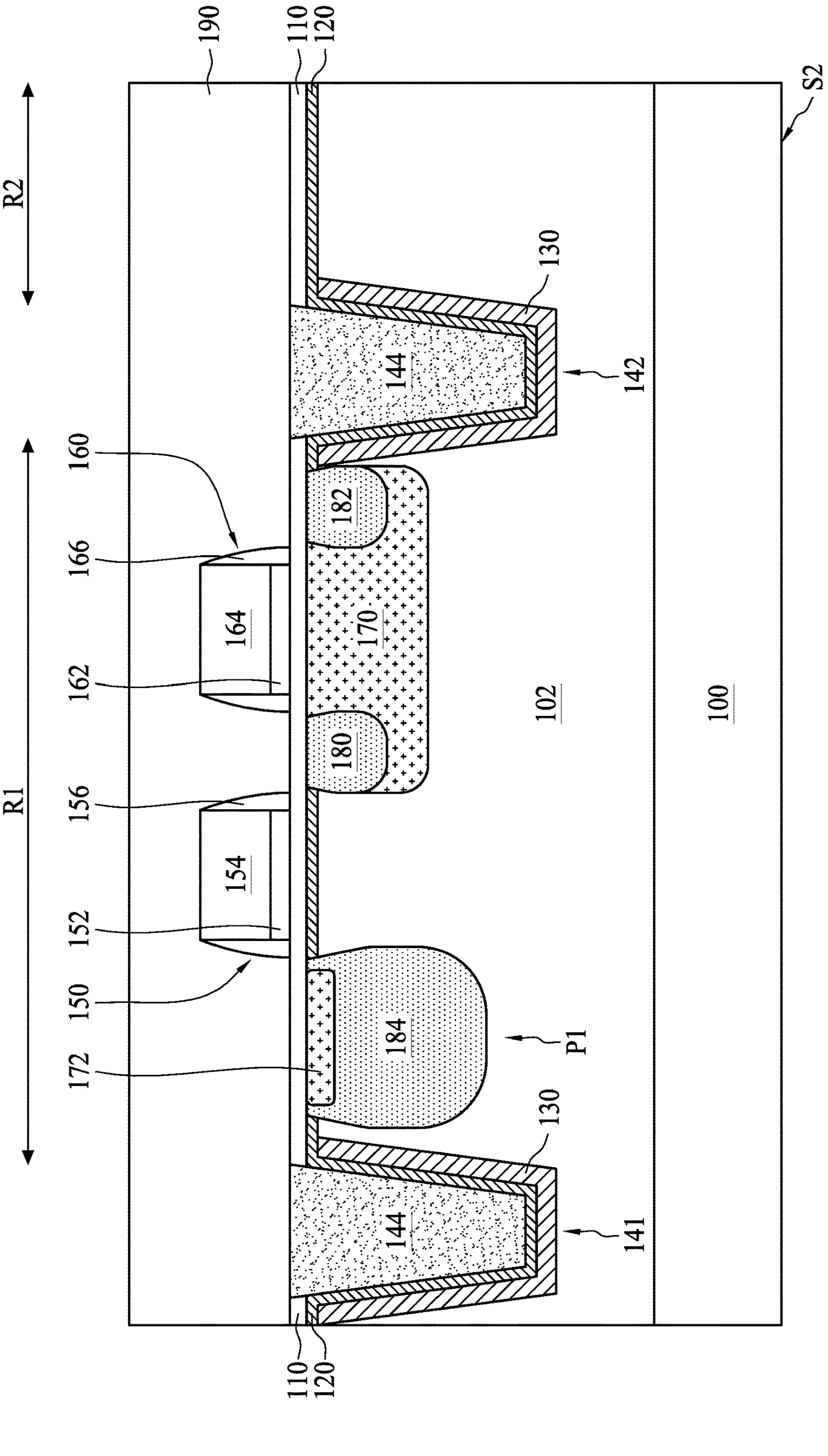

Referring to operation 231 of FIG. 2, an interlayer dielectric (ILD) layer 190 is deposited over the transfer transistor 150 and the reset transistor 160, as shown in FIG. 19. The ILD layer 190 may be formed using LPCVD, PECVD or other suitable operations. The ILD layer 190 may be made from silicon oxide or borophosphosilicate glass (BPSG). The ILD layer 190 may cover the barrier layer 100 and the isolation features 141, 142. Then, a CMP operation may be used for planarization, thereby creating a smooth top surface topography for the ILD layer 190.

Figure 20:
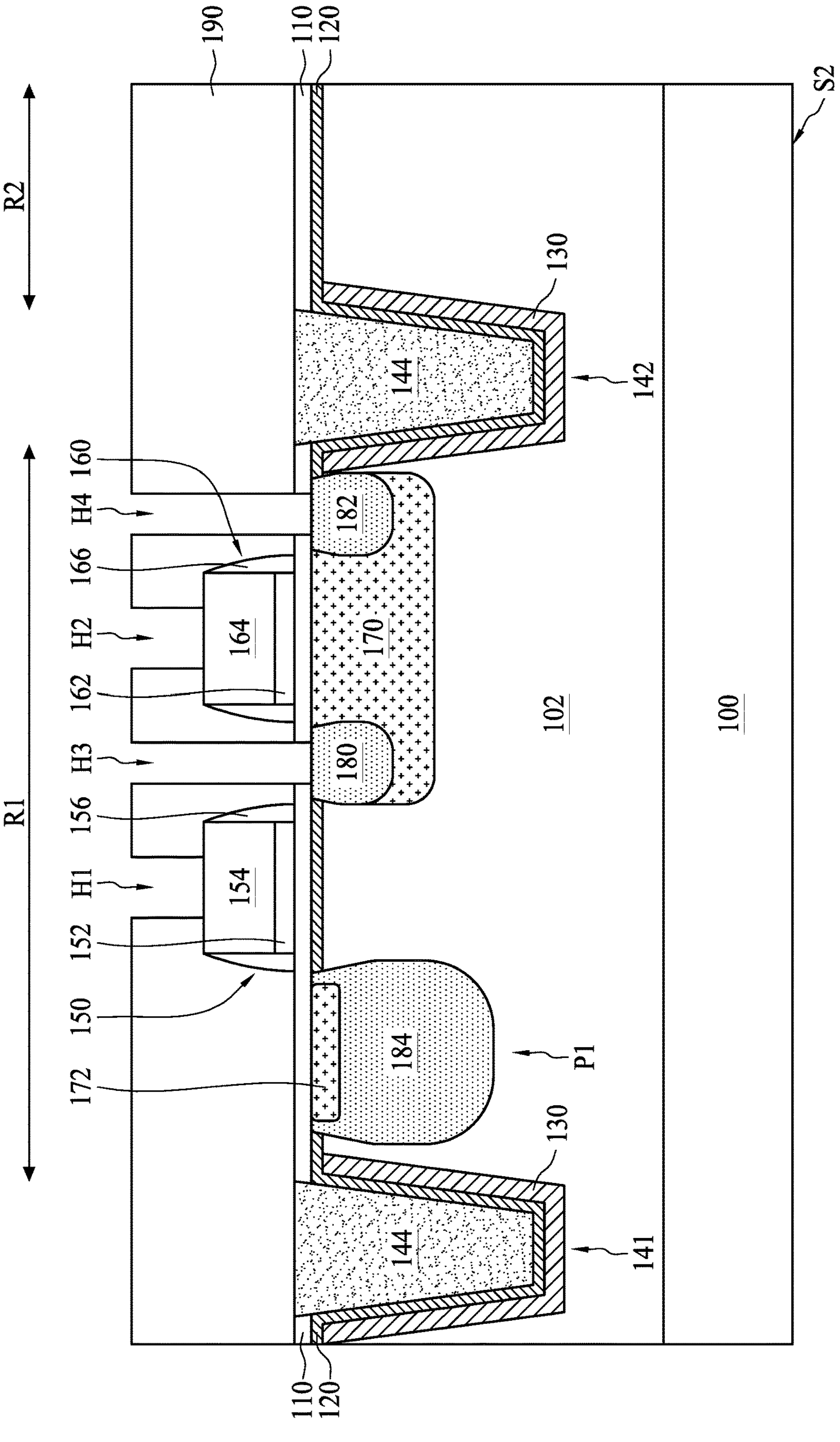

Referring to operation 233 of FIG. 2, multiple contact holes H1, H2, H3 and H4 are formed in the ILD layer 190, as shown in FIG. 20. The formation of the contact holes H1, H2, H3 and H4 may include a series of lithographic and etch operations. Portions of the ILD layer 190 may be removed using etch operations in succession. The contact hole H1 may expose the conductive layer 154 of the transfer transistor 150, and the contact hole H2 may expose the conductive layer 164 of the reset transistor 160. The contact hole H3 may expose the floating diffusion region 180, and the contact hole H4 may expose the source/drain region 182.

Figure 21:
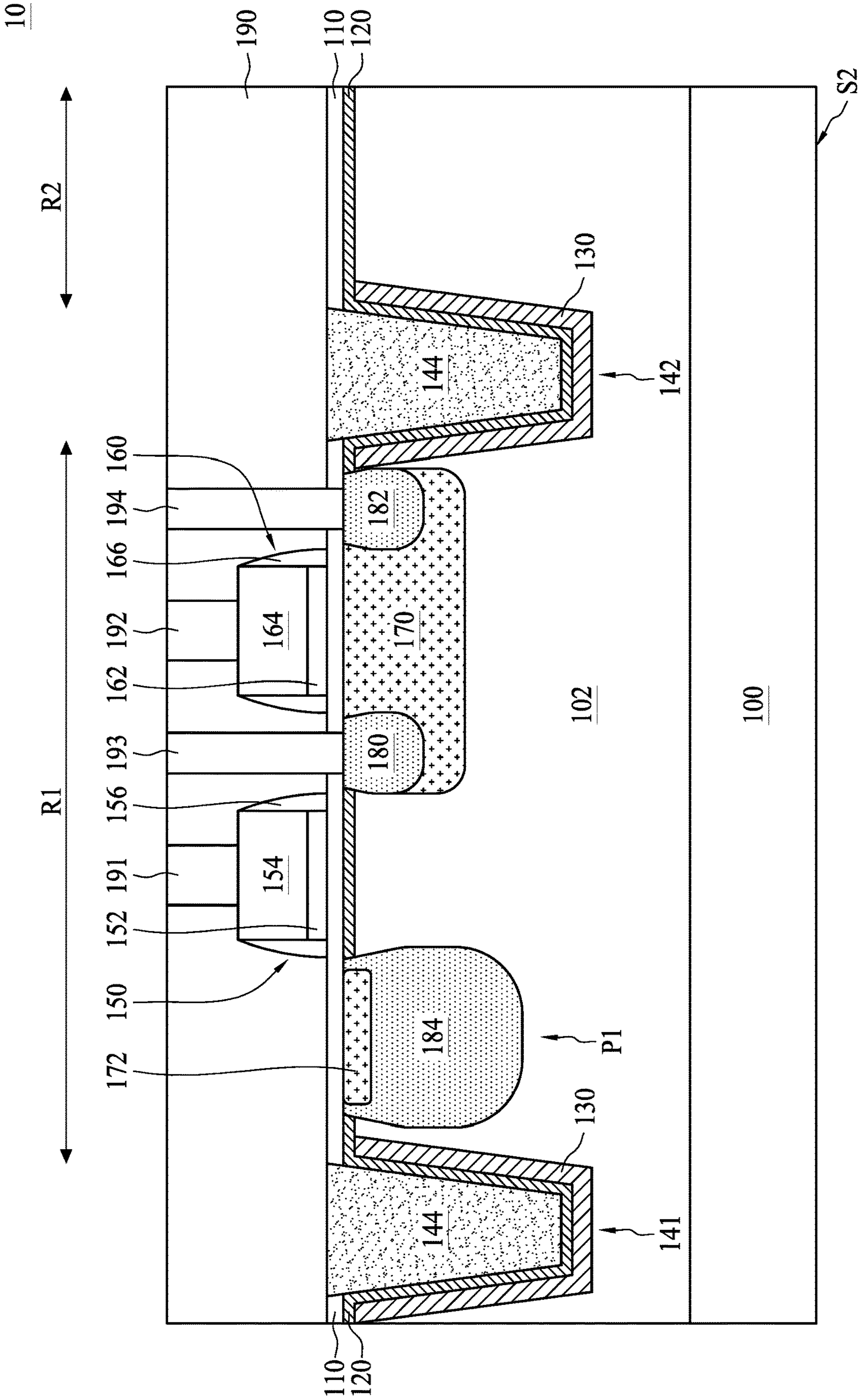

Referring to operation 235 of FIG. 2, multiple conductive vias 191, 192, 193 and 194 are respectively formed in the contact holes H1, H2, H3 and H4, as shown in FIG. 21. A conductive material may deposited into the contact holes H1, H2, H3 and H4 using electroplating, PVD, CVD, and/or other suitable methods. The conductive material may include one or more conductive materials, such as tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), or other suitable materials. As such, the conductive via 191 is formed in the contact hole H1, the conductive via 192 is formed in the contact hole H2, the conductive via 193 is formed in the contact hole H3, and the conductive via 194 is formed in the contact hole H4. The conductive vias 191, 192, 193 and 194 are formed in the ILD layer 190. In some embodiments, the conductive vias 191, 192, 193 and 194 are electrically coupled to the transfer transistor 150, reset transistor 160, the floating diffusion region 180 and the source/drain region 182, respectively.

Subsequent operations may be performed on the semiconductor structure 10 to fabricate other semiconductor devices on the semiconductor structure 10. Referring to FIG. 22, the semiconductor structure 10 is flipped with the second surface S2 facing upward. Each light sensing area 210 in FIG. 22 may include the photodiode P1, the p-type well 170, the floating diffusion region 180 and the source/drain region 182 shown in FIG. 21. The light sensing areas 210 may be alternately arranged with isolation features containing the densified HARP oxide 144, which is similar to the HARP oxide 140 shown in previous figures. A doping layer or an oxide layer (not shown) may be selectively formed on the second surface S2 of the substrate 100, followed by an anti-reflective layer 220 formed on the substrate 100 (or the doping or oxide layer). The anti-reflective layer 220 may be a silicon nitride layer, a silicon oxynitride layer, a carbon-doping silicon nitride layer, a carbon-doping silicon oxynitride layer, or a combination thereof. Then, at least a color filter 230 is formed on the anti-reflective layer 220. In some embodiments, a blue filter 232, a green filter 234 and a red filter 236 are respectively formed on the anti-reflective layer 220, but it is not limited thereto. In some other embodiments, color filters with different color series may be formed, depending upon the needs. Each of the blue, green and red filters 232, 234 and 236 may correspond to each of the light sensing areas 230.

Referring to FIG. 23, microlenses 242, 244 and 246 are respectively formed on each of the blue, green and red filters 232, 234 and 236 to focus light emitted into each of the color filters 230. A passivation layer (not shown) may be selectively and respectively formed on each of the microlenses 242, 244 and 246. At this stage, the formation of a backside illumination (BSI) CMOS image sensor (CIS) 20 is completed.

One aspect of the present disclosure provides a method of manufacturing a semiconductor structure of a CMOS image sensor (CIS) device. The method includes: providing a substrate; growing an epitaxial layer on the substrate; forming a barrier layer on the epitaxial layer; forming a trench extending into the epitaxial layer; oxidizing a top surface of the epitaxial layer to form a liner layer; defining a region of a photodiode and a first dopant thickness; implanting dopants into the epitaxial layer around a sidewall of the trench to form a protective layer with a second dopant thickness less than the first dopant thickness; forming an oxide layer in the trench; performing an annealing operation to densify the oxide layer to form a densified oxide layer, wherein the protective layer, expanded from the second dopant thickness to a third dopant thickness less than the first dopant thickness, is kept spaced from the region; and forming the photodiode in the region.

One aspect of the present disclosure provides another method of manufacturing a semiconductor structure. The method includes: providing a substrate; converting a top portion of the substrate into an epitaxial layer; forming an barrier layer on the epitaxial layer; and forming an isolation feature to define a pixel region in the substrate, wherein the forming of the isolation feature includes: forming a trench in the epitaxial layer; converting a top portion of the epitaxial layer into an oxide layer by thermal oxidation; implanting dopants into the epitaxial layer to form a protective layer around a sidewall of the trench; and filling the trench by a dielectric material to form the isolation feature with a first density, wherein the dielectric material over a top surface of the barrier layer has a first thickness when the trench is filled; annealing the dielectric material to cause a second density, greater than the first density, of the isolation feature and expand the dopants of the protective layer in thickness by less than ten times; and forming a photodiode adjacent to the isolation feature, wherein a diffusion of the dopant during the annealing of the oxide keeps separated from the photodiode.

One aspect of the present disclosure provides another method of manufacturing a semiconductor structure of a CIS device. The method includes: defining a predetermined distance; providing a substrate; forming a hard mask layer over the substrate; recessing the hard mask layer and the substrate to form a trench; converting a top portion of the substrate layer to form an oxide layer; forming a doped region in the substrate and below the hard mask layer, wherein the doped region surrounds the trench with a first dopant thickness no more than one tenth of the predetermined distance; forming an oxide layer in the trench; densifying the oxide layer and expanding the doped region to a second dopant thickness less than the predetermined distance; and forming a space charge region adjacent to the isolation feature and spaced apart from the doped region by the predetermined distance.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure of a CMOS image sensor (CIS) device, comprising:
providing a substrate;
growing an epitaxial layer on the substrate;
forming a barrier layer on the epitaxial layer;
forming a trench extending into the epitaxial layer;
oxidizing a top surface of the epitaxial layer to form an oxide liner layer;
defining a region where a photodiode is to be formed in a later time, and determining a first thickness, wherein the substrate is solid across the first thickness that is measured from a sidewall of the oxide liner layer to a boundary of the region of the photodiode;
implanting dopants into the epitaxial layer around a sidewall of the trench to form a semiconductor protective layer with a second thickness less than the first thickness;
forming an oxide layer in the trench;
performing an annealing operation on the oxide layer using in-situ steam generation to form a densified oxide layer from the oxide layer without inducing any oxidation, wherein the semiconductor protective layer, expanding from the second thickness to a third thickness less than the first thickness, is kept spaced from the region; and
forming the photodiode in the region.

2. The method of claim 1, wherein the annealing operation is performed subsequent to the forming of the semiconductor protective layer.

3. The method of claim 1, wherein the in-situ steam generation is performed under a pressure range of about 1 Torr and about 10 Torr with a duration between about 5 seconds and about 30 seconds.

4. The method of claim 1, further comprising adjusting an amount of ozone ($O_3$) and tetraethyl orthosilicate (TEOS) to varying a ratio of oxygen atoms to silicon atoms (O/Si) of the oxide layer.

5. The method of claim 1, wherein the oxidizing of the epitaxial layer comprises oxidizing the epitaxial layer along a bottom and a sidewall of the trench.

6. The method of claim 1, wherein during the forming of the oxide layer, the oxide layer accumulated at edges of the trench, approaches two sides and then finally merges at a middle of the trench.

7. The method of claim 1, wherein after the annealing operation of the oxide layer, an isolation feature including the densified oxide layer is formed.

8. The method of claim 6, wherein after the annealing operation of the oxide layer, the dopants surround the densified oxide layer.

9. A method of manufacturing a semiconductor structure of a CMOS image sensor device, comprising:
forming an epitaxial layer on a substrate;
forming a barrier layer on the epitaxial layer;
form a trench extending into the epitaxial layer;
oxidizing a top portion of the epitaxial layer to form an oxide liner layer;
defining a region adjacent to the trench where a photodiode is to be formed in a later time and determining a first thickness, wherein the substrate is solid across the first thickness that is measured from a sidewall of the oxide liner layer to a boundary of the region of the photodiode;
implanting dopants into the epitaxial layer on a sidewall of the trench to form a semiconductor protective region and with a second thickness less than the first thickness;
forming an oxide layer in the trench;
performing an annealing operation on the oxide layer using in-situ steam generation to form a densified oxide layer from the oxide layer without inducing any oxidation, wherein the semiconductor protective region, expanding from the second thickness to a third thickness less than the first thickness, is kept spaced from the region; and
forming the photodiode in the region.

10. The method of claim 9, wherein the oxide layer is generated from ozone (03) and tetraethyl orthosilicate (TEOS).

11. The method of claim 9, wherein the dopants include boron.

12. The method of claim 9, wherein the annealing operation on the oxide layer uses a rapid thermal annealing (RTA) operation in a duration less than 30 seconds.

13. The method of claim 9, wherein the annealing operation on the oxide layer is performed at a temperature of about 950° C. to about 1050° C. and at a pressure of about 1 torr to about 10 torr.

14. The method of claim 9, wherein the semiconductor protective region is formed below the oxide liner layer and within the epitaxial layer.

15. A method of manufacturing a semiconductor structure of a CMOS image sensor device, comprising:
providing a substrate;
growing an epitaxial layer on the substrate;
forming a barrier layer on the epitaxial layer;
forming a trench extending into the epitaxial layer;
oxidizing upper portions of the epitaxial layer to form an oxide liner layer;
defining a region where a photodiode is to be formed in a later time and determining a first thickness, wherein the substrate is solid across the first thickness that is measured from a sidewall of the oxide liner layer to a boundary of the region of the photodiode;
implanting dopants into the epitaxial layer to form a semiconductor protective layer with a second thickness less than the first thickness;
forming a dielectric material in the trench;
performing an annealing operation on the dielectric material using in-situ steam generation (ISSG) to form a densified dielectric material from the dielectric material without inducing any oxidation, wherein the semiconductor protective layer, expanding from the second thickness to a third thickness less than the first thickness, is kept spaced from the region; and
forming the photodiode in the region.

16. The method of claim 15, further comprising forming a transistor over the epitaxial layer and adjacent to the region, wherein the photodiode is between the transistor and the semiconductor protective layer.

17. The method of claim 15, wherein the dopants in the epitaxial layer are separated from the region.

18. The method of claim 15, wherein the forming of the dielectric material uses a sub-atmospheric chemical vapor deposition (SACVD) operation.

19. The method of claim 15, wherein the annealing operation is performed after the semiconductor protective layer is formed.

20. The method of claim 19, wherein nitrogen is introduced in an ISSG chamber during the annealing operation.

* * * * *